(12) United States Patent
Jin et al.

(10) Patent No.: US 11,923,314 B2
(45) Date of Patent: Mar. 5, 2024

(54) SEMICONDUCTOR PACKAGE INCLUDING A TRENCH IN A PASSIVATION LAYER

(71) Applicant: SAMSUNG ELECTRONICS CO., LTD., Suwon-si (KR)

(72) Inventors: Ik Kyu Jin, Cheonan-si (KR); Jin Su Kim, Seoul (KR); Ki Ju Lee, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 431 days.

(21) Appl. No.: 17/203,312

(22) Filed: Mar. 16, 2021

(65) Prior Publication Data

US 2021/0398908 A1    Dec. 23, 2021

(30) Foreign Application Priority Data

Jun. 18, 2020  (KR) ...................... 10-2020-0074048

(51) Int. Cl.
*H01L 23/538*    (2006.01)
*H01L 23/00*    (2006.01)
*H01L 23/31*    (2006.01)
*H01L 25/10*    (2006.01)

(52) U.S. Cl.
CPC ...... *H01L 23/5389* (2013.01); *H01L 23/3128* (2013.01); *H01L 23/5383* (2013.01); *H01L 23/5386* (2013.01); *H01L 24/20* (2013.01); *H01L 25/105* (2013.01); *H01L 2224/214* (2013.01); *H01L 2225/1035* (2013.01); *H01L 2225/1058* (2013.01); *H01L 2924/19106* (2013.01)

(58) Field of Classification Search
CPC ............ H01L 23/5389; H01L 21/4853; H01L 21/4857; H01L 21/565; H01L 23/3128; H01L 23/5383; H01L 23/5385; H01L 23/5386; H01L 24/16; H01L 2224/16227; H01L 2924/19103; H01L 2924/19105
See application file for complete search history.

(56) References Cited

U.S. PATENT DOCUMENTS 6,940,182 B2    9/2005    Hilton et al.
8,228,682 B1    7/2012    Zohni et al.
8,294,279 B2    10/2012    Chen et al.
(Continued)

*Primary Examiner* — Fernando L Toledo
*Assistant Examiner* — Neil R Prasad
(74) *Attorney, Agent, or Firm* — Myers Bigel, P.A.

(57) ABSTRACT

A semiconductor package includes a connection structure including a redistribution layer, a plurality of under bump metal layers electrically connected to the redistribution layer, a passivation layer which overlaps at least portions of side faces of the plurality of under bump metal layers, and includes a first trench disposed between under bump metal layers adjacent to each other, a surface mounting element which is on the under bump metal layers adjacent to each other, connected to the redistribution layer, and overlaps the first trench, and an underfill material layer that is between a portion of the passivation layer and the surface mounting element, and is in the first trench. The first trench extends in a first direction and includes a first sub-trench having a first width in a second direction, and a second sub-trench having a second width different from the first width in the second direction.

19 Claims, 17 Drawing Sheets

(56) References Cited

U.S. PATENT DOCUMENTS

| | | |
|---|---|---|
| 8,558,360 B2 | 10/2013 | Lee et al. |
| 8,693,211 B2 | 4/2014 | Tamadate |
| 8,901,727 B2 | 12/2014 | Kang et al. |
| 9,245,865 B1 | 1/2016 | Kwon et al. |
| 9,799,813 B2 | 10/2017 | Choi et al. |
| 10,410,885 B2 | 9/2019 | Darveaux |
| 2017/0244012 A1* | 8/2017 | Choi ........................ H01L 33/62 |
| 2018/0226272 A1* | 8/2018 | Darveaux ............ H01L 21/4864 |
| 2020/0185330 A1* | 6/2020 | Yu ............................ H01L 24/19 |

* cited by examiner

SEMICONDUCTOR PACKAGE INCLUDING A TRENCH IN A PASSIVATION LAYER

CROSS-REFERENCE TO RELATED APPLICATIONS

This application claims priority under 35 U.S.C. § 119 to Korean Patent Application No. 10-2020-0074048, filed on Jun. 18, 2020 in the Korean Intellectual Property Office, the disclosure of which is incorporated by reference herein in its entirety.

TECHNICAL FIELD

Embodiments of the present disclosure relate to a semiconductor package.

BACKGROUND

As demand increases for high-performance element realization, the size of the semiconductor chip may increase, and the size of a semiconductor package may increase accordingly. The thickness of the semiconductor package may decrease due to a trend for slimmer electronic devices. Accordingly, a thickness of a surface mounting element may also become thinner.

The surface mounting element may be attached to a substrate of a semiconductor region using solder balls to reduce signal noise. An underfill process may be used to improve the reliability of the mounted surface mounting element.

SUMMARY

Aspects of the present disclosure provide a semiconductor package in which a passivation layer disposed under a surface mounting element includes a trench with a gradually reduced width, thereby uniformly forming an underfill material layer and improving product reliability.

According to an example embodiment of the present disclosure, a semiconductor package includes a connection structure including a redistribution layer, a plurality of under bump metal layers on the connection structure and electrically connected to the redistribution layer, a passivation layer on the connection structure, such that the passivation layer overlaps at least portions of side faces of the plurality of under bump metal layers, and includes a first trench between under bump metal layers adjacent to each other among the plurality of under bump metal layers, a surface mounting element that is on the under bump metal layers adjacent to each other, that is electrically connected to the redistribution layer, and that overlaps the first trench, and an underfill material layer that is between a portion of the passivation layer and the surface mounting element, and is in the first trench. The first trench extends in a first direction that is a length direction of the surface mounting element, and includes a first sub-trench having a first width in a second direction perpendicular to the first direction, and a second sub-trench having a second width different from the first width in the second direction.

According to an example embodiment of the present disclosure, a semiconductor package includes a connection structure including a redistribution layer, under bump metal layers on the redistribution layer, such that under bump metal layers extend in a first direction and are spaced apart from each other in a second direction different from the first direction, a passivation layer on the connection structure, such that the passivation layer overlaps at least portions of side faces of the under bump metal layers and has an I-shaped trench extending in the first direction between the under bump metal layers, a surface mount element on the under bump metal layers and electrically connected to the redistribution layer through the under bump metal layers, and an underfill material layer that is between a portion of the passivation layer and a portion of the under bump metal layers, and is in the I-shaped trench.

According to an example embodiment of the present disclosure, a connection structure includes a redistribution layer and an insulating layer on the redistribution layer, and includes a first face and a second face opposite to each other; a molding layer on the first face of the connection structure, including an opening that overlaps at least a part of the redistribution layer, a semiconductor chip in the opening, and including a chip pad on the semiconductor chip, such that the chip pad is electrically connected to the redistribution layer, a core layer including a core insulating layer, and a penetration via that penetrates the core insulating layer and is electrically connected to the redistribution layer, on a side face of the semiconductor chip, a first under bump metal layer and second under bump metal layers connected to the redistribution layer, such that the first under bump metal layer and the second under bump metal layers are on the second face of the connection structure, a passivation layer on at least a part of respective side faces of the first under bump metal layer and the second under bump metal layers, and includes a trench extending in a first direction between ones of the second under bump metal layers adjacent to each other, a solder ball on the first under bump metal layer, a surface mounting element electrically connected to the second under bump metal layers by a connection member and overlapping the trench, and an underfill material layer that is between the passivation layer and the surface mounting element, and is in the trench. The trench includes a first trench extending in the first direction, and second and third trenches each connected to the first trench and spaced apart from each other in the first direction. The first trench includes first to third sub-trenches having respective first to third widths in a second direction that intersects the first direction and is a length direction of the connection structure. The second sub-trench is between the first sub-trench and the third sub-trench, and the second width is wider than the first width and smaller than the third width, and the respective second and third widths of the second and third trenches in the second direction are wider than a width of the surface mounting element in the second direction.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

BRIEF DESCRIPTION OF THE DRAWINGS

The above and other aspects and features of the present disclosure will become more apparent by describing in detail example embodiments thereof with reference to the attached drawings, in which.

DETAILED DESCRIPTION

Figure 1:
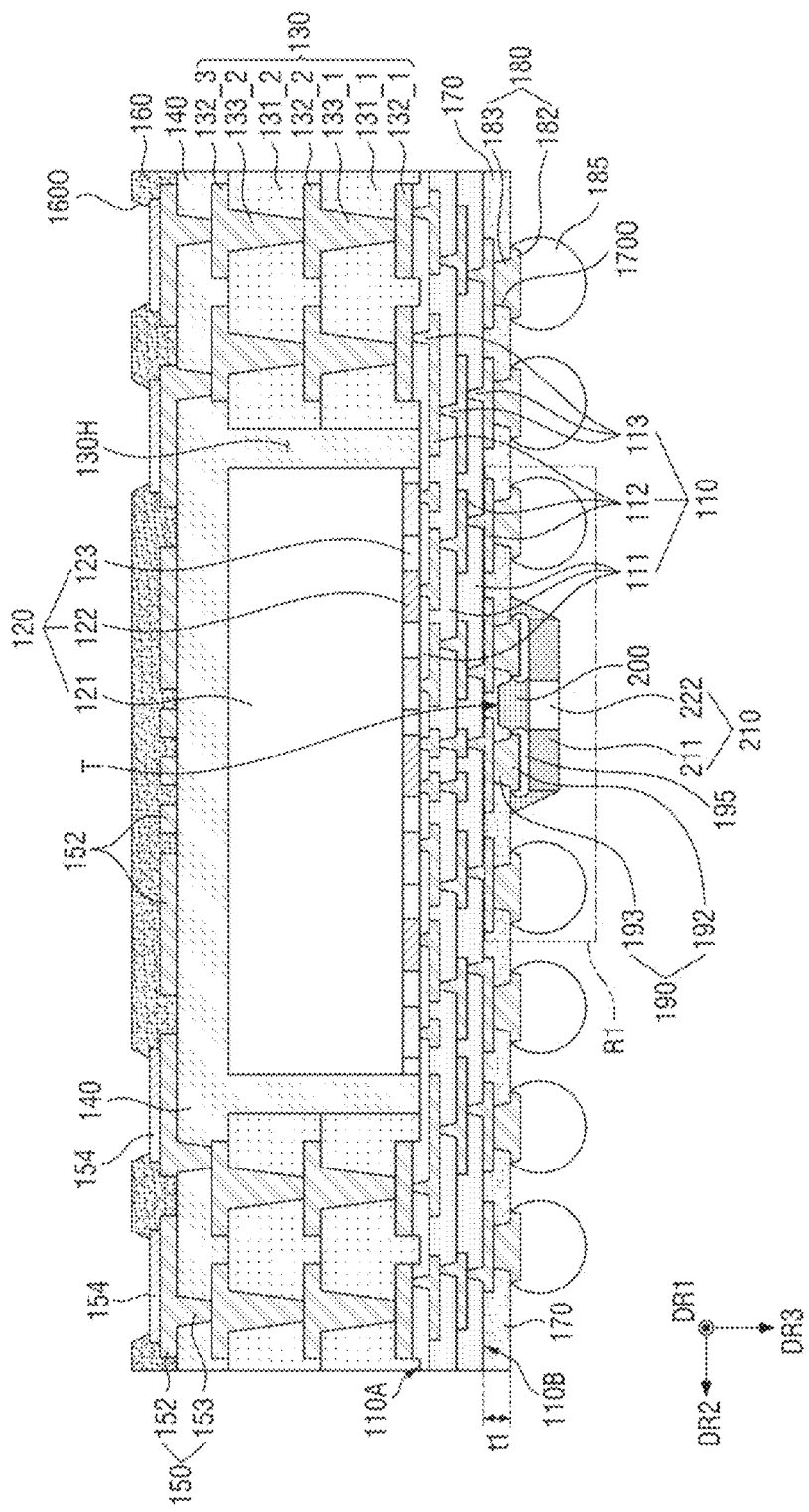
FIG. 1 is a diagram of a semiconductor package according to example embodiments.

FIG. 1 is a diagram of a semiconductor package according to example embodiments.

Referring to FIG. 1, the semiconductor package according to some embodiments of the present disclosure may include a first connection structure 110, a first semiconductor chip 120, a core layer 130, a first molding layer 140, a second connection structure 150, a solder ball 185 and a connection member 195.

The first connection structure 110 may include a first face 110A and a second face 110B opposite to each other. For example, the first face 110A and the second face 110B may be opposite to each other in a third direction DR3. The first face 110A may be a lower base on the basis of the third direction DR3, and the second face 110B may be an upper face. Here, the third direction DR3 may be a thickness direction of the first connection structure 110.

The first connection structure 110 may include a plurality of first redistribution layers 112, a plurality of first vias 113 and a plurality of first insulating layers 111.

The first insulating layers 111 may be sequentially stacked, for example, in the third direction DR3 from the first face 110A to the second face 110B. In this drawing, although the first connection structure 110 is shown to include three insulating layers as a non-limiting example, the number of the first insulating layers 111 may vary without departing from the scope of the inventive concepts.

The first insulating layer 111 may include, for example, a photoimageable dielectric (PID).

The first insulating layers 111 may include the same material as each other, or may include different materials from each other. In FIG. 1, although a boundary of the first insulating layers 111 is shown, this boundary is illustrated for convenience of explanation. Depending on the process of forming the first insulating layers 111 or the material for forming the first insulating layers 111, the boundary between the first insulating layers 111 may be uncertain or merged together.

The first redistribution layers 112 may be formed inside the first insulating layers 111. The first redistribution layers 112 may be sequentially stacked, for example, in the third direction DR3 from the first face 110A to the second face 110B.

The first redistribution layers 112 shown in this drawing are examples, and the number, position, or arrangement of the first redistribution layers 112 may vary. Also, although the first redistribution layers 112 are shown to have the same size as each other, this is for convenience of explanation. For example, the thickness of the first redistribution layers 112 may gradually increase from the second face 110B toward the first face 110A.

The first redistribution layers 112 may include a conductive material. Therefore, the first redistribution layers 112 may redistribute a chip pad 122 of the first semiconductor chip 120 to be described later. The first redistribution layers 112 may include, for example, but is not limited to, at least one of copper (Cu), aluminum (Al), silver (Ag), tin (Sn), gold (Au), nickel (Ni), lead (Pb), titanium (Ti) and alloys thereof.

The first redistribution layers 112 may perform various functions, depending on the design of the layer. For example, the first redistribution layers 112 may include a ground pattern, a power pattern, a signal pattern, and/or the like. The signal pattern may input and/or output, for example, various electric signals other than the ground signal and the power signal, for example, data electric signals and/or the like.

The first vias 113 may penetrate the first insulating layers 111 and connect the first redistribution layers 112 to each other. The width of the first vias 113 may increase in a direction from the first face 110A to the second face 110B.

For example, the semiconductor package according to some embodiments may be formed by an RDL last process. In this case, the first connection structure 110 may be formed by being stacked on the surface of the first semiconductor chip 120 on which the chip pad 122 is formed, and on the surface of the first molding layer 140. For example, the first insulating layers 111 may be formed by being sequentially stacked in the direction from the first face 110A to the second face 110B. The first vias 113 may be formed through an etching process of removing some of the first insulating layers 111 to expose a part of the chip pad 122.

The first vias 113 shown in this drawing are merely an example, and the number, position, or arrangement of the first vias 113 may vary. Also, although the first vias 113 are shown to have the same size as each other as a non-limiting example, this is for convenience of explanation.

Also, the first vias 113 are shown to completely fill the trench in the first insulating layers 111, but this is a non-limiting example. For example, the first vias 113 may also have a shape that extends along the profile of the trench in first insulating layers 111.

The first vias 113 may include a conductive material. Therefore, an electrical route which connects the first face 110A and the second face 110B may be formed in the first connection structure 110. The first vias 113 may include, for example, but is not limited to, at least one of copper (Cu), aluminum (Al), silver (Ag), tin (Sn), gold (Au), nickel (Ni), lead (Pb), titanium (Ti), and/or alloys thereof.

The core layer 130 may be disposed on the first face 110A of the first connection structure 110. The core layer 130 may include a penetration hole 130H penetrating the core layer 130 in the third direction DR3. The penetration hole 130H may be disposed at the center of the core layer 130.

The penetration hole 130H shown in this drawing is merely an example, and the number, position, or arrangement of the penetration holes 130H may of course be various. Further, the penetration hole 130H may have a cavity shape without completely penetrating the core layer 130.

The core layer 130 may include a plurality of core insulating layers 131_1 and 131_2, a plurality of core wiring layers 132_1, 132_2 and 132_3, and/or a plurality of core vias 133_1 and 133_2.

The core insulating layers 131_1 and 131_2 may be sequentially stacked in the third direction DR3. For example, the first core insulating layer 131_1 may be disposed on the first face 110A of the first connection structure 110, and the second core insulating layer 131_2 may be disposed on the first core insulating layer 131_1. Although this drawing shows that two core insulating layers are included, this is non-limiting example, and the number of core insulating layers 131_1 and 131_2 may vary.

The core insulating layers 131_1 and 131_2 may include, for example, an insulating material, such as a thermosetting resin such as an epoxy resin or a thermoplastic resin such as a polyimide, and may further include inorganic filler. Or, the core insulating layers 131_1 and 131_2 may include a resin impregnated in a core material such as glass fiber (glass cloth and glass fabric) together with the inorganic filler, for example, prepreg, ABF (Ajinomoto Build-up Film), FR-4, or BT (Bismaleimide Triazine).

The core wiring layers 132_1, 132_2 and 132_3 may be disposed in the core insulating layers 131_1 and 131_2. The core wiring layers 132_1, 132_2 and 132_3 may be sequentially stacked in the third direction DR3. For example, the first core wiring layer 132_1 may be disposed in the first core insulating layer 131_1, the second core wiring layer 132_2 may be disposed in the second core insulating layer 131_2, and the third core wiring layer 132_3 may be disposed in the first molding layer 140 on the second core insulating layer 131_2.

The first core wiring layer 132_1 may be indented into the first core insulating layer 131_1. That is, the lower face of the first core wiring layer 132_1 in the third direction DR3 and the lower face of the first core insulating layer 131_1 in the third direction DR3 may have a step. This step may prevent the first molding layer 140 from contaminating the first core wiring layer 132_1.

The core vias 133_1 and 133_2 may penetrate the core insulating layers 131_1 and 131_2 to connect the core wiring layers 132_1, 132_2 and 132_3 to each other. For example, the first core via 133_1 may penetrate the first core insulating layer 131_1 to connect the first core wiring layer 132_1 and the second core wiring layer 132_2, and the core via 133_2 may penetrate the second core insulating layer 131_2 to connect the second core wiring layer 132_2 and the third core wiring layer 132_3 to each other.

The core wiring layers 132_1, 132_2 and 132_3 and the core vias 133_1 and 133_2 may include a conductive material. Therefore, an electrical route which connects the upper and lower faces in the third direction DR3 may be formed in the core layer 130. The core wiring layers 132_1, 132_2 and 132_3 and the core vias 133_1 and 133_2 may include, but is not limited to, for example, at least one of copper (Cu), aluminum (Al), silver (Ag), tin (Sn), gold (Au), nickel (Ni), lead (Pb), titanium (Ti), and/or alloys thereof.

The first semiconductor chip 120 may be mounted on the first face 110A of the first connection structure 110. The first semiconductor chip 120 may be disposed in the penetration hole 130H of the core layer 130. The side faces of the first semiconductor chip 120 may be surrounded by the core layer 130.

The first semiconductor chip 120 may be an integrated circuit (IC) in which hundreds to millions or more semiconductor elements are integrated in a single chip. For example, the first semiconductor chip 120 may be, but is not limited to, an application processor (AP) such as a CPU (Central Processing Unit), a GPU (Graphic Processing Unit), a FPGA (Field-Programmable Gate Array), a digital signal processor, an encryption processor, a microprocessor, and/or a microcontroller. For example, the first semiconductor chip 120 may be a logic scale chip such as an ADC (Analog-Digital Converter) or an ASIC (Application-Specific IC), and may also be a memory chip such as a volatile memory (e.g., DRAM) or a non-volatile memory (e.g., a ROM or a flash memory). Of course, the first semiconductor chip 120 may be configured by combining these.

The first semiconductor chip 120 may include, for example, a body 121, a chip pad 122 and a passivation film 123, Various semiconductor elements may be formed in the body 121. The body 121 may include, for example, bulk silicon or a SOI (silicon-on-insulator). The body 121 may be a silicon substrate or may include, but is not limited to, other materials such as silicon germanium, a SGOI (silicon germanium on insulator), indium antimonide, lead tellurium compound, indium arsenide, indium phosphide, gallium arsenide or gallium antimonide.

The chip pad 122 may be formed on the surface of the body 121. The chip pad 122 may be electrically connected to an electric circuit formed in the body 121, for example, a circuit pattern or the like. The chip pad 122 may include, for example, but is not limited to, aluminum (Al).

The chip pad 122 may be connected to the first connection structure 110. As a result, the first semiconductor chip 120 may be electrically connected to the first connection structure 110. For example, the first via 113 of the first connection structure 110 may be formed to penetrate the first insulating layer 111 and be connected to the chip pad 122. The chip pad 122 may be redistributed by the first connection structure 110.

The passivation film 123 may be formed on the surface of the body 121. Further, the passivation film 123 may expose at least a part of the chip pad 122. For example, the passivation film 123 may be formed to cover or overlap a part of the chip pad 122. The passivation film 123 may include, for example, but is not limited to, an oxide film or a nitride film.

The first molding layer 140 may be disposed on a first face 110A of the first connection structure 110. The first molding layer 140 may cover at least a part of the first semiconductor chip 120 and the core layer 130. For example, the first molding layer 140 may fill the penetration hole 130H and may extend onto the upper faces of the first semiconductor chip 120 and the core layer 130.

The first molding layer 140 may include an insulating material. For example, the first molding layer 140 may include a thermosetting resin such as epoxy resin, a thermoplastic resin such as polyimide, or resin in which these resins are mixed with an inorganic filler or impregnated in the core material such as a glass fiber (Glass Cloth, and Glass Fabric) (e.g., prepreg, ABF (Ajinomoto Build-up Film), FR-4, BT (Bismaleimide Triazine)). Or, the first molding layer 140 may include a photoimageable dielectric (PID).

The second connection structure 150 may be disposed on the first molding layer 140 and the core layer 130. The second connection structure 150 may include a plurality of second redistribution layers 152 and a plurality of second vias 153.

The second redistribution layers 152 may be disposed on the first molding layer 140. The second vias 153 may be disposed on the core wiring layers 132_1, 132_2 and 132_3 of the core layer 130 to penetrate the first molding layer 140. The second vias 153 may connect the core wiring layers 132_1, 132_2 and 132_3 and the second redistribution layer 152.

The second redistribution layers 152 and the second vias 153 may include a conductive material. Therefore, the second connection structure 150 may be electrically connected to the first semiconductor chip 120 and the first connection structure 110. Further, the second connection structure 150 may redistribute the chip pad 122 of the first semiconductor chip 120.

The second redistribution layers 152 and the second vias 153 may include, for example, but is not limited to, at least one of copper (Cu), aluminum (Al), silver (Ag), tin (Sn), gold (Au), nickel (Ni), lead (Pb), titanium (Ti), and/or alloys thereof.

The second redistribution layers 152 and the second vias 153 shown in the drawings are merely examples, and the number, position, or arrangement of the second redistribution layers 152 and the second vias 153 may vary. The second connection structure 150 may further include, for example, a second insulating layer disposed on the upper face of the first molding layer 140, and the second vias 153 may be disposed to penetrate the second insulating layer 151.

The first passivation layer 160 may be disposed on the second connection structure 150. The first passivation layer 160 may include a first opening 1600 which exposes at least a part of the second redistribution layer 152. The first passivation layer 160 may be made of an insulating material, and may be made of, for example, but is not limited to, a resin.

The connection pad 154 may be disposed on a first opening 1600. The connection pad 154 may be formed by plating such as precious metal plating. The connection pad 154 may be formed by, for example, but is not limited to, electrolytic gold plating, electroless gold plating, OSP or electroless tin plating, electroless silver plating, electroless nickel plating/substitution gold plating, DIG plating, HASL, and the like. Therefore, the connection pad 154 may be connected to the second redistribution layer 152.

The second passivation layer 170 may be disposed on the second face 110B of the first connection structure 110. The second passivation layer 170 may include a second opening 1700 which exposes at least a part of the first redistribution layer 112. The second passivation layer 170 may be made of an insulating material such as, for example, but is not limited to, a resin.

The second passivation layer 170 according to some embodiments of the present disclosure may include a trench T on the upper face in the third direction DR3. A bottom face of the trench T in the third direction DR3 may be placed inside the second passivation layer 170. That is, the bottom face of the trench T in the third direction DR3 may be placed on the lower side in the third direction DR3 than the upper face of the second passivation layer 170 in the third direction DR3.

Also, the bottom face of the trench T in the third direction DR3 may be placed, for example, on the upper side in the third direction DR3 than the first redistribution layer 112. The bottom face of the trench T in the third direction DR3 may be placed, for example, on the upper side in the third direction DR3 than the bottom face of the second opening 1700.

The trench T may extend in the first direction DR1 and may not be uniform in width in the second direction DR2. The width of the trench T in the first direction DR1 may be gradually reduced, for example, in the first direction DR1. Here, the second direction DR2 may be a length direction of the first connection structure 110. Also, the first to third directions DR1, DR2 and DR3 may intersect each other.

The trench T may be formed by etching the second passivation layer 170. The trench T according to some embodiments may be formed by a photolithography method using, for example, a laser drill or an exposure phenomenon. Hereinafter, a detailed description will be given with reference to FIGS. 2 to 7.

Under bump metal layers 180 and 190 may be disposed on the second opening 1700. The under bump metal layers 180 and 190 may include a first under bump metal layer 180, and a second under bump metal layer 190 on which a surface mounting element 210 to be described below is disposed.

The first under bump metal layer 180 may include a first UBM pad 182 and a first UBM via 183. The first UBM pad 182 may be disposed on the second passivation layer 170. The first UBM pad 182 may protrude, for example, from the second passivation layer 170 in the third direction DR3. However, in some other embodiments, the upper face of the first UBM pad 182 in the third direction DR3 may be placed on the same plane as the upper face of the second passivation layer 170 in the third direction DR3. The first UBM via 183 may penetrate the second passivation layer 170 to connect the first UBM pad 182 and the first redistribution layer 112.

The second under bump metal layer 190 may include a second UBM pad 192 and a second UBM via 193. The second UBM pad 192 may be disposed on the second passivation layer 170. The second UBM pad 192 may protrude, for example, from the second passivation layer 170 in the third direction DR3. However, in some other embodiments, the upper face of the second UBM pad 192 in the third direction DR3 may be placed on the same plane as the upper face of the second passivation layer 170 in the third direction DR3. The second UBM via 193 may penetrate the second passivation layer 170 to connect the second UBM pad 192 and the first redistribution layer 112.

The widths of the first and second UBM vias 183 and 193 may increase in the direction from the first face 110A to the second face 110B. For example, the semiconductor package according to some embodiments may be formed by an RDL last process. In this case, the first and second UBM vias 183 and 193 may be formed after the first connection structure 110 is formed. For example, the first and second UBM vias 183 and 193 may be formed through an etching process of removing a part of the second passivation layer 170 to expose a part of the first redistribution layer 112.

The first and second under bump metal layers 180 and 190 shown in FIG. 1 are examples, and the number, position or arrangement of the first and second under bump metal layers 180 and 190 may vary.

First solder balls 185 may be disposed on the first under bump metal layer 180. The first solder balls 185 may come into contact with the first UBM pad 182. Therefore, the first solder balls 185 may be electrically connected to the first connection structure 110.

The first solder balls 185 may include a substance of a solder material. For example, each of the first solder balls 185 may include, but is not limited, at least one of lead (Pb), tin (Sn), indium (In), bismuth (Bi), antimony (Sb), silver (Ag), and/or alloys thereof.

The connection member 195 may be disposed on the second under bump metal layer 190. The connection member 195 may come into contact with the second UBM pad 192. Therefore, the connection member 195 may be electrically connected to the first connection structure 110. The connection member 195 may be, for example, a solder paste.

The surface mounting element 210 may be disposed on the second face 110B of the first connection structure 110. The surface mounting element 210 may overlap, for example, the first semiconductor chip 120. The surface mounting element 210 may include an element body 222, and external electrodes 211 disposed on both sides of the element body 222.

The external electrode 211 may be disposed on the connection member 195. The external electrode 211 may be in contact with the connection member 195, and may be electrically connected to the first connection structure 110 and the first semiconductor chip 120 through the connection member 195 and the second under bump metal layer 190.

The surface mounting element 210 may include various types of passive components or various forms of surface-mountable components. The passive component may include, for example, an MLCC (Multi Layer Ceramic Capacitor), an LICC (Low Inductance Chip Capacitor), an LSC (Land Side Capacitor), an inductor, an integrated passive device (IPD), and/or the like. The surface mounting element 210 may be an LSC in the semiconductor package according to some embodiments.

The first underfill material layer 200 may be disposed on the second passivation layer 170. The first underfill material layer 200 may fill between the second passivation layer 170 and the surface mounting element 210. The first underfill material layer 200 may cover or overlap the side face of the surface mounting element 210 and the lower face in the third direction DR3. In addition, the first underfill material layer 200 may wrap the connection member 195 between the second passivation layer 170 and the surface mounting element 210, and may fill between the connection members 195.

The first underfill material layer 200 according to some embodiments of the present disclosure may at least partially fill the trench T. This will be described in detail below with reference to FIGS. 2 to 7.

The first underfill material layer 200 may include an underfill resin such as an epoxy resin or a silica filler.

Figure 2:
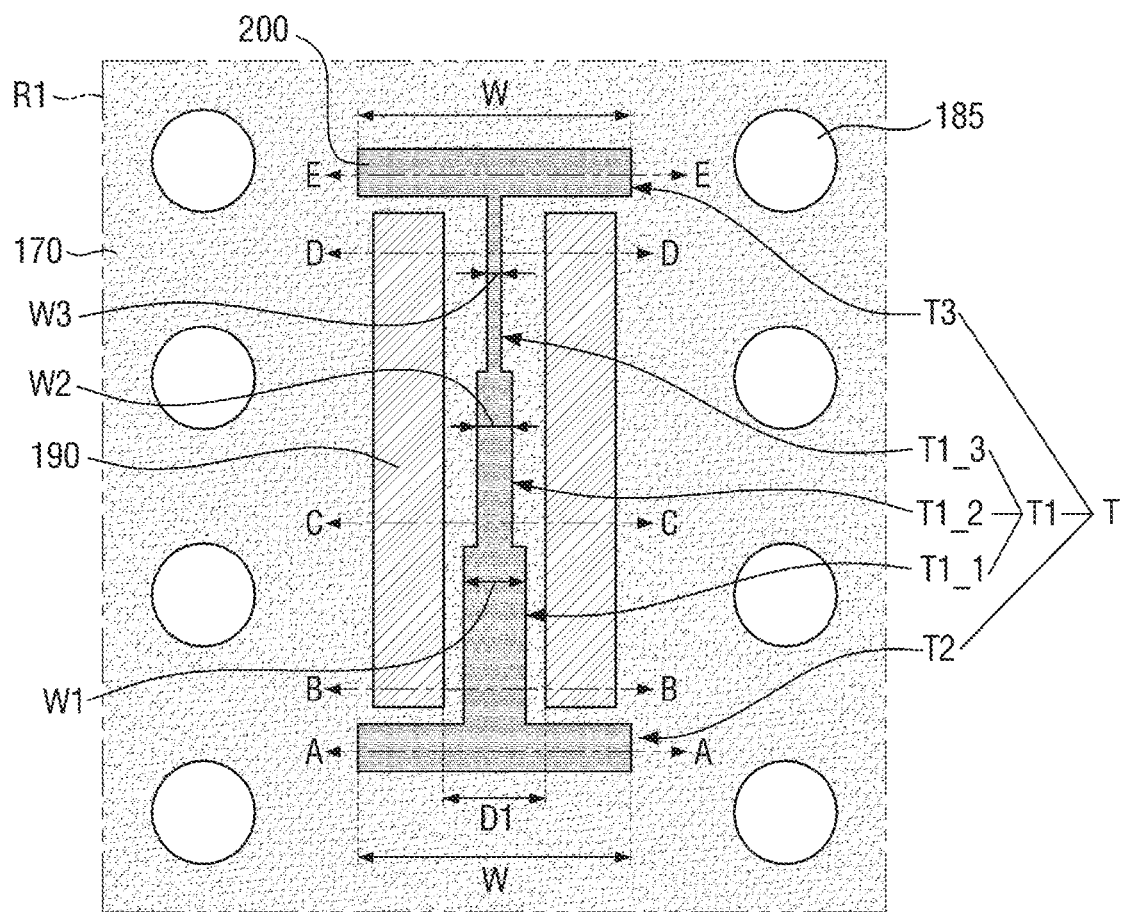
FIG. 2 is an enlarged view in which a region R1 of the semiconductor package of FIG. 1 is enlarged, according to example embodiments.
Figure 2:
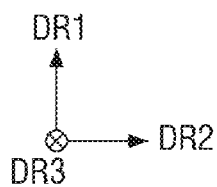
Figure 3:
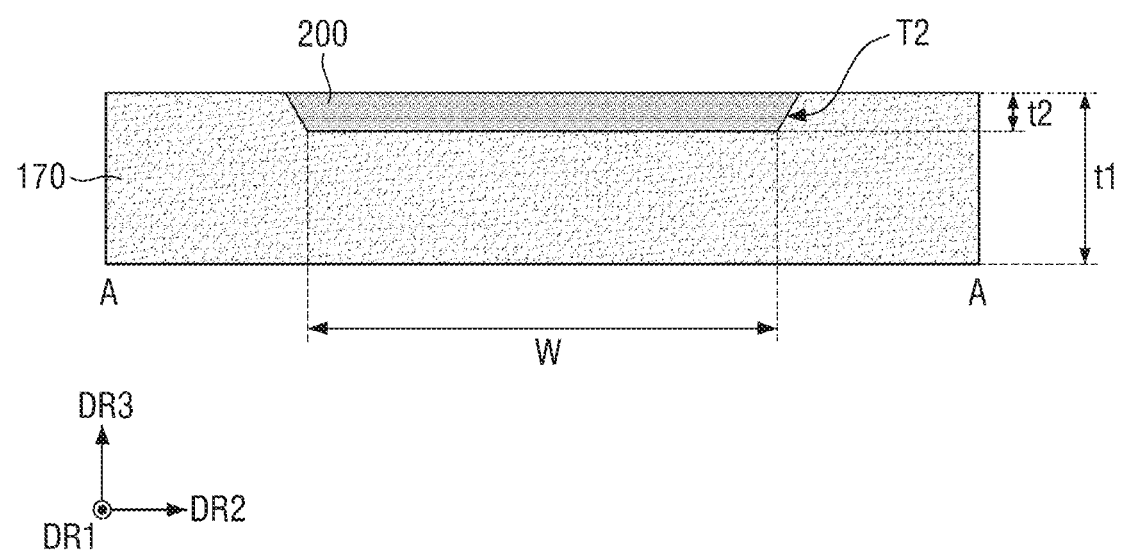
FIG. 3 is a cross-sectional view taken along a line A-A of FIG. 2, according to example embodiments.
Figure 4:
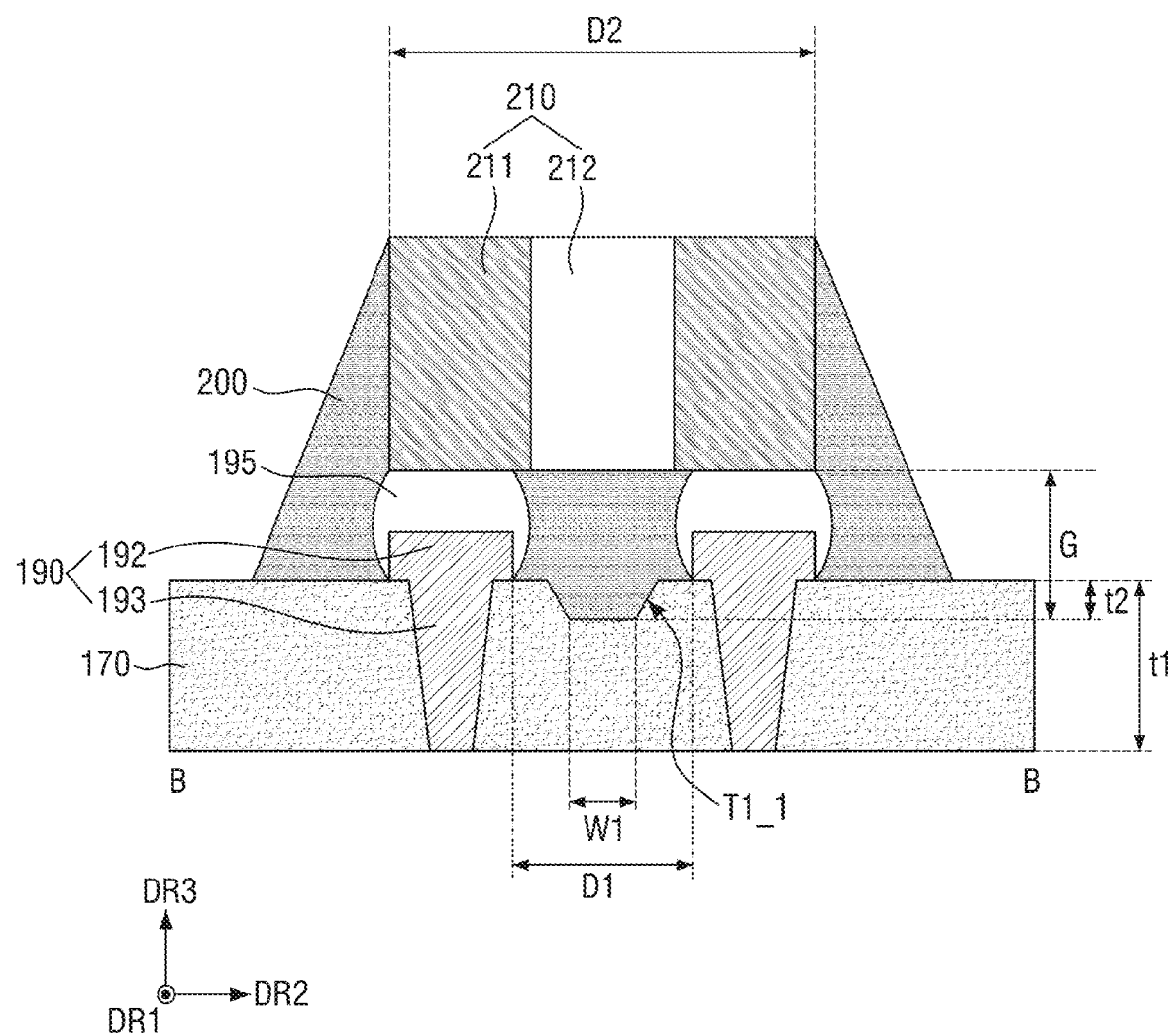
FIG. 4 is a cross-sectional view taken along a line B-B of FIG. 2, according to example embodiments.
Figure 5:
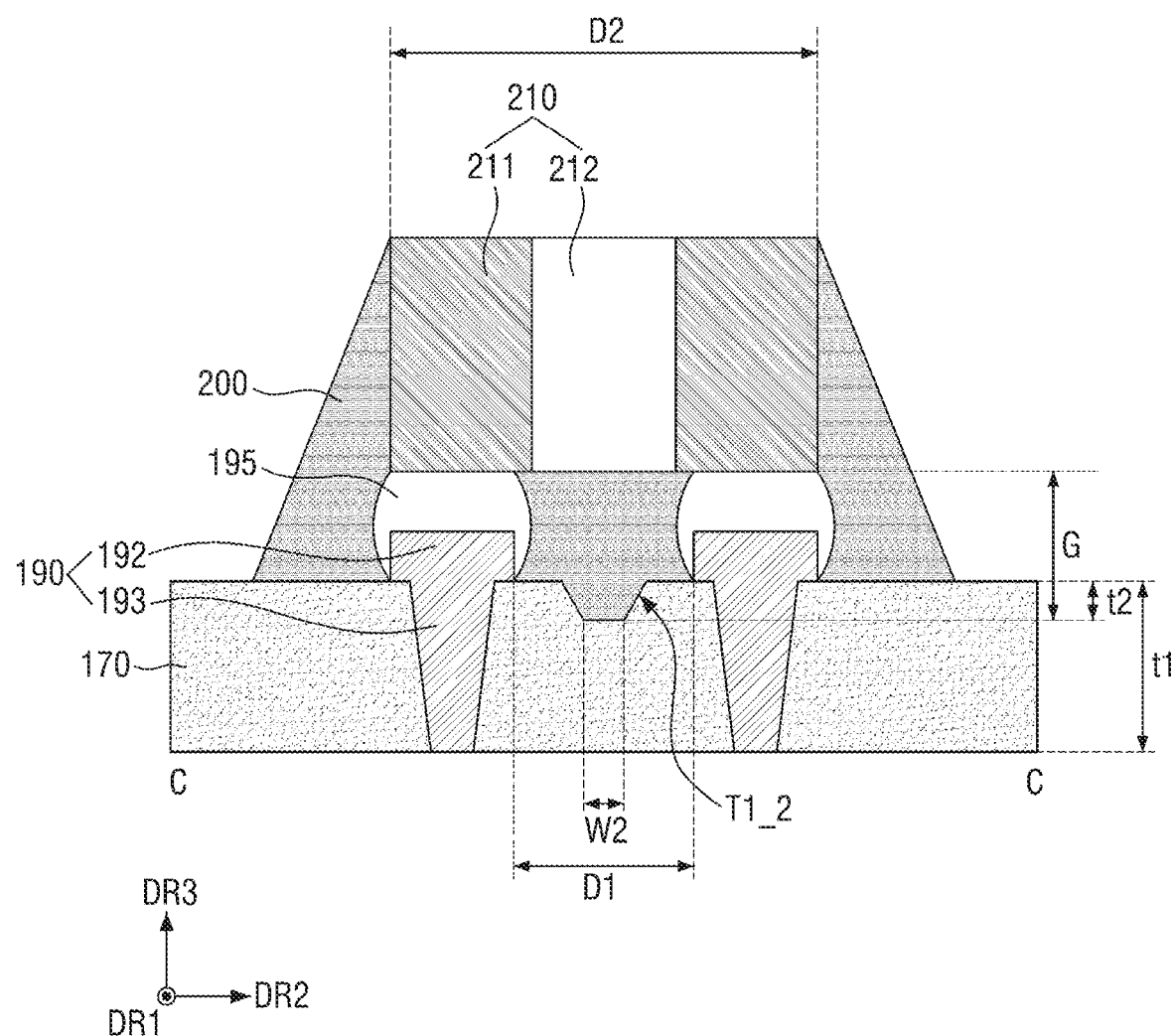
FIG. 5 is a cross-sectional view taken along a line C-C of FIG. 2, according to example embodiments.
Figure 6:
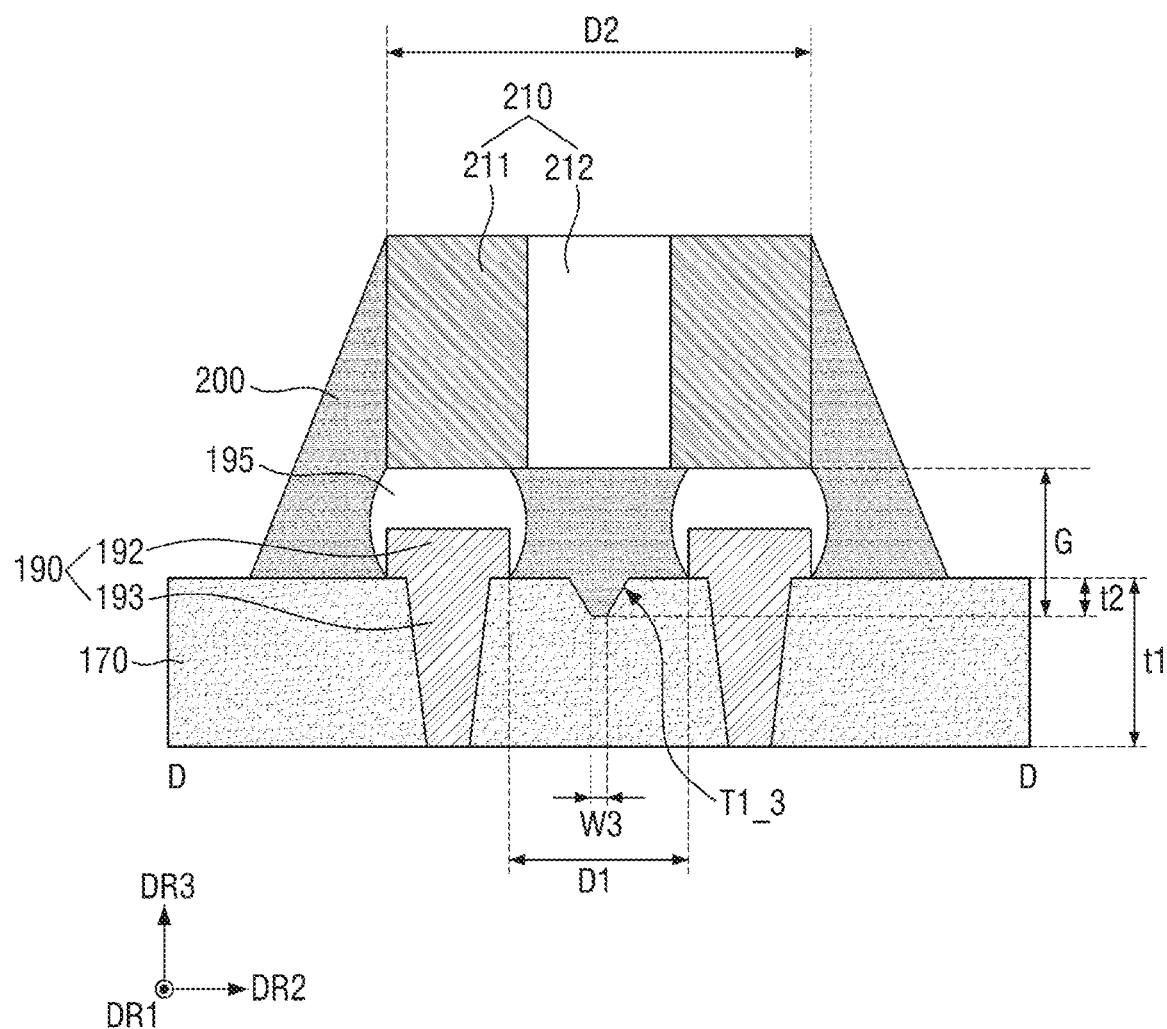
FIG. 6 is a cross-sectional view taken along a line D-D of FIG. 2, according to example embodiments.
Figure 7:
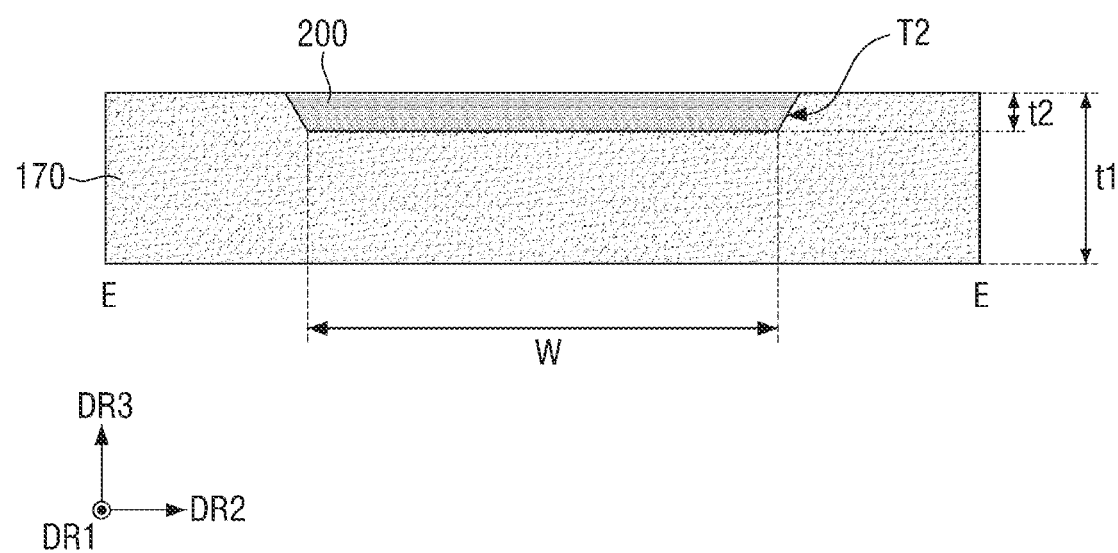
FIG. 7 is a cross-sectional view taken along a line E-E of FIG. 2, according to example embodiments.

FIG. 2 is an enlarged view in which a region R1 of FIG. 1 is enlarged. For convenience of explanation, the connection member 195 and the surface mounting element 210 are not shown in FIG. 2. FIG. 3 is a cross-sectional view taken along a line A-A of FIG. 2. FIG. 4 is a cross-sectional view taken along a line B-B of FIG. 2. FIG. 5 is a cross-sectional view taken along a line C-C of FIG. 2. FIG. 6 is a cross-sectional view taken along a line D-D of FIG. 2. FIG. 7 is a cross-sectional view taken along a line E-E of FIG. 2.

Referring to FIGS. 1 to 7, the second passivation layer 170 may include a trench T on an upper face in the third direction DR3. A depth t1 of the trench T in the third direction DR3 may be, for example, equal to or less than 0.5 times a thickness t2 of the second passivation layer 170 in the third direction DR3. The depth t1 of the trench T in the third direction DR3 according to some embodiments may be approximately 0.5 times the thickness t2 of the second passivation layer 170 in the third direction DR3.

A gap G between the second passivation layer 170 and the surface mounting element 210 may be increased by the trench T. For example, the gap G between the second passivation layer 170 and the surface mounting element 210 may be increased by the depth t1 of the trench T.

The first underfill material layer 200 may be formed by being injected between the second passivation layer 170 and the surface mounting element 210. In a semiconductor package according to some embodiments of the present disclosure, since the gap G between the second passivation layer 170 and the surface mounting element 210 is increased by the trench T, the flow of the first underfill material layer 200 filled by a capillary force may be improved or enhanced. Therefore, the first underfill material layer 200 may be more smoothly filled.

Meanwhile, the second under bump metal layers 190 which may extend in the first direction DR1 may be spaced apart from each other in the second direction DR2. The second under bump metal layers 190 may be disposed between the first solder balls 185 adjacent to each other in the second direction DR2. Here, the second direction DR2 may be the length direction of the second connection structure 110.

The surface mounting element 210 may be electrically connected to the first connection structure 110 and the first semiconductor chip 120 through the second under bump metal layer 190. That is, the external electrode 211 of the surface mounting element 210 may be disposed on the second under bump metal layer 190.

The trench T may be disposed between the second under bump metal layers 190 adjacent to each other. The trench T may be disposed between the second under bump metal layers 190 spaced apart from each other in the second direction DR2. That is, the surface mounting element 210 may be disposed to overlap the trench T.

The trench T may have an I shape. The trench T may extend in the first direction DR1. The trench T may include first to third trenches T1, T2 and T3.

The first trench T1 may be disposed between the second under bump metal layers 190 spaced apart from each other in the second direction DR2. That is, the first trench T1 may be disposed below the surface mounting element 210 in the third direction DR3. The first trench T1 may overlap the surface mounting element 210.

The first trench T1 may extend in the first direction DR1. The first trench T1 may extend to be longer than the second under bump metal layer 190 in the first direction DR1. The first trench T1 may include first to third sub-trenches T1_1, T1_2 and T1_3 that have varying widths.

The first sub-trench T1_1 may be disposed to be adjacent to one end of the second under bump metal layer 190. The first sub-trench T1_1 may have a first width W1 in the second direction DR2. The first width W1 may be, for example, approximately 0.6 times the distance D1 between the second under bump metal layers 190 in the second direction DR2.

In the semiconductor package according to some embodiments, the distance from the second UBM pad 192 to the first sub-trench T1_1 in the second direction DR2 may be 350 μm or more.

A second sub-trench T1_2 may be connected to the first sub-trench T1_1 and the third sub-trench T1_3. The second sub-trench T1_2 may be disposed between the first sub-trench T1_1 and a third trench T3 to be described later. The second sub-trench T1_2 may have a second width W2 in the second direction DR2. The second width W2 may be smaller than the first width W1. The second width W2 may be, for example, approximately 0.4 times the distance D1 between the second under bump metal layers 190 in the second direction DR2.

A third sub-trench T1_3 may be disposed to be adjacent to the other end of the second under bump metal layer 190. The third sub-trench T1_3 may be connected to the second sub-trench T1_2. The third sub-trench T1_3 may have a third width W3 in the second direction DR2. The third width W3 may be smaller than the first and second widths W1 and W2. The third width W3 may be, for example, approximately 0.2 times the distance D1 between the second under bump metal layers 190 in the second direction DR2.

That is, the first width W1 may be approximately three times the third width W3, and the second width W2 may be approximately twice the third width W3. The width of the first trench T1 in the second direction DR2 may gradually decrease in the first direction DR1, according to some embodiments.

The second trench T2 and the third trench T3 may be spaced apart from each other in the first direction DR1, and may extend in the second direction DR2. The second trench T2 and the third trench T3 may be connected to each other by the first trench T1. For example, the first trench T1 may connect the central portions of the second trench T2 and the third trench T3.

The width W of the second trench T2 in the third direction DR3 and the width W of the third trench T3 in the third direction DR3 may be greater than the first to third widths W1, W2 and W3 of the first trench T1 in the direction DR3. The width W of the second trench T2 in the third direction DR3 and the width of the third trench T3 in the third direction DR3 may be greater than the distance D1 between the second under bump metal layers 190 in the second direction DR2.

Also, the width W of the second trench T2 in the third direction DR3 and the width W of the third trench T3 in the third direction DR3 be smaller than the distance between the first solder balls 185 adjacent to each other in the second direction DR2. That is, the second and third trenches T2 and T3 may be disposed between the first solder balls 185 adjacent to each other in the second direction DR2.

The width W of the second trench T2 in the third direction DR3 and the width W of the third trench T3 in the third direction DR3 may be substantially the same. The width W of the second and third trenches T2 and T3 in the third direction DR3 may be greater than the distance D1 between the second under bump metal layers 190 adjacent to each other in the second direction DR2. For example, the width W of the second and third trenches T2 and T3 in the third direction DR3 may be approximately 1.1 times the width of the surface mounting element 210 in the second direction DR2.

The second trench T2 is, for example, an injection part of the first underfill material layer 200, and the third trench T3 may be a discharge part of the first underfill material layer 200. That is, the first underfill material layer 200 may be injected into the second trench T2 and discharged to the third trench T3 through the first trench T1.

In the semiconductor device according to some embodiments of the present disclosure, since the first underfill material layer 200 is injected through the trench T in which the width gradually decreases in the first and/or third direction, it is possible to prevent a phenomenon in which the capillary force gradually decreases from the injection port toward the discharge port. This enables the first underfill material layer 200 to be more uniformly filled between the second passivation layer 170 and the surface mounting element 210 and into the trench T by the capillary force.

Also, it is possible to prevent a phenomenon in which the capillary force is reduced, such that unfilled portions are generated between the second passivation layer 170 and the surface mounting element 210 and in the trench T, and/or air is trapped. Therefore, the reliability of the surface mounting element 210 may be improved or enhanced by the first underfill material layer 200 in the semiconductor package according to some embodiments of the present disclosure.

Also, in the semiconductor package according to some embodiments of the present disclosure, the second trench T2 and the third trench T3 may be filled with the first underfill material layer 200 which is left or remaining after filling the first trench T1. Since the widths W of the second and third trenches T2 and T3_ are larger or greater than the widths W1, W2 and W3 of the first trenches T1, the excessively ejected first underfill material layer 200 may be filled in the second and third trenches T2 and T3. Accordingly, it is possible to prevent the ejected first underfill material layer 200 from being formed on the adjacent first solder ball 185. That is, since the semiconductor package according to some embodiments of the present disclosure may secure a margin of the first underfill material layer 200 by the second and third trenches T2 and T3, reliability can be improved or enhanced.

Figure 8:
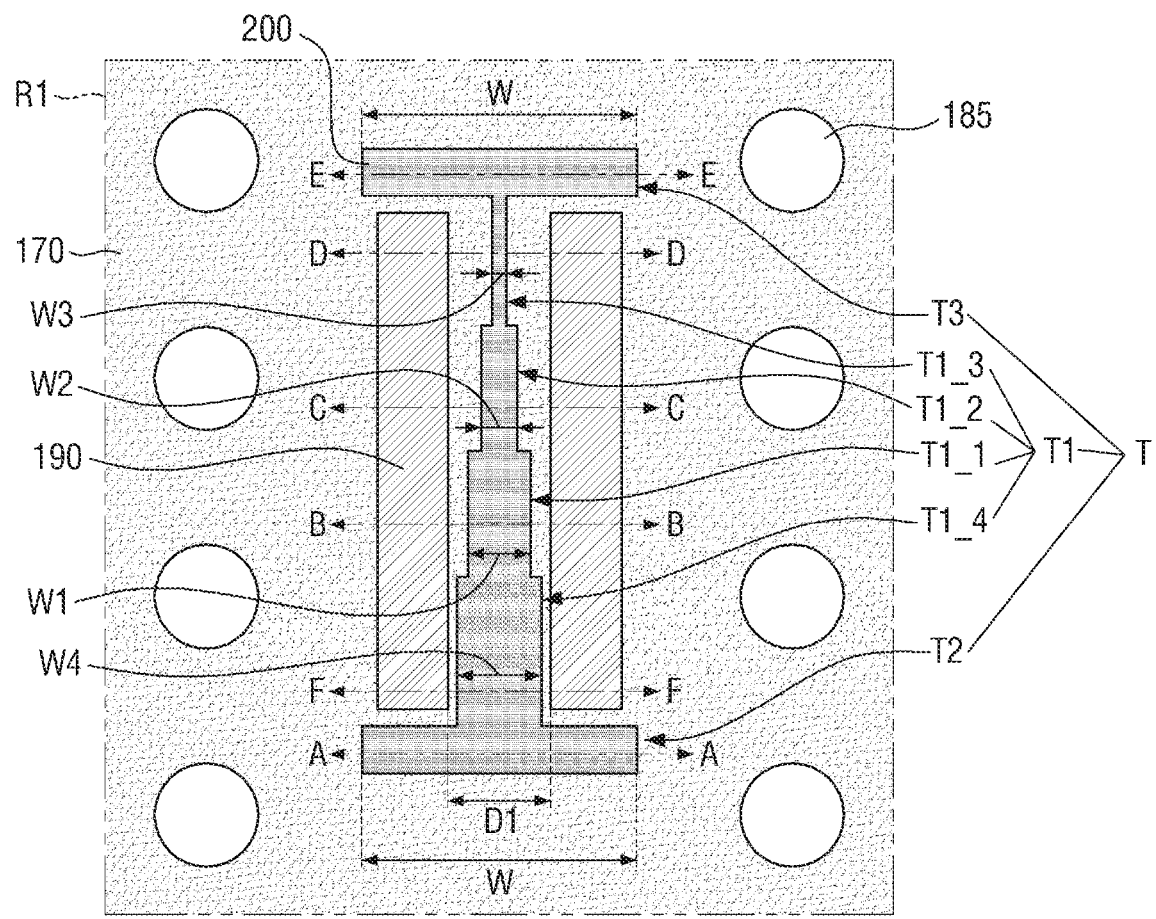
FIG. 8 is an enlarged view in which the region R1 of the semiconductor package of FIG. 1 is enlarged, according to example embodiments.
Figure 8:
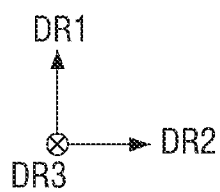
Figure 9:
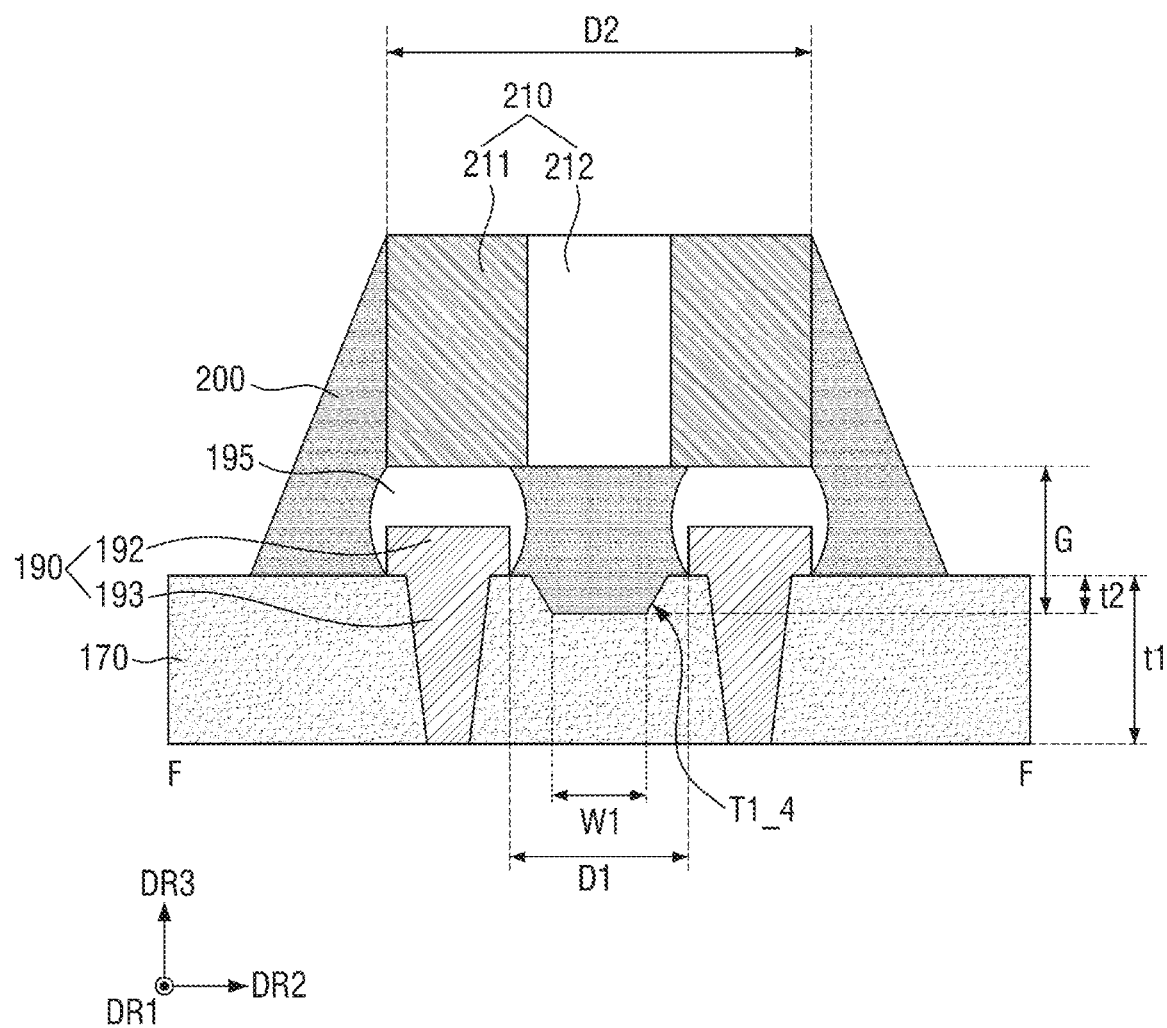
FIG. 9 is a cross-sectional view taken along a line F-F of FIG. 8, according to example embodiments.

FIG. 8 is an enlarged view in which the region R1 of FIG. 1 is enlarged. FIG. 9 is a cross-sectional view taken along a line F-F of FIG. 8. For convenience of explanation, points different from those explained with reference to FIGS. 2 to 7 will be mainly explained when referring to FIG. 8.

Referring to FIGS. 1, 8 and 9, a semiconductor package according to example embodiments may further include a fourth sub-trench T1_4. The first trench T1 may include first to fourth sub-trenches T1_1, T1_2, T1_3 and T1_4.

The fourth sub-trench T1_4 may be disposed between the first sub-trench T1_1 and the second trench T2. The fourth sub-trench T1_4 may have a fourth width W4 in the second direction DR2. The fourth width W4 may be greater than the first to third widths W1, W2 and W3. The first width W1 may be, for example, approximately 0.8 times the distance D1 in the second direction DR2 between the second under bump metal layers 190.

That is, the fourth width W4 may be approximately four times the third width W3. The width of the first trench T1 in the second direction DR2 may gradually decrease in the first direction DR1.

The first trench T1 according to some embodiments of the present disclosure is not limited thereto, and may further include a plurality of sub-trenches in which a width in the second direction DR2 gradually decreases in the first direction.

Figure 10:
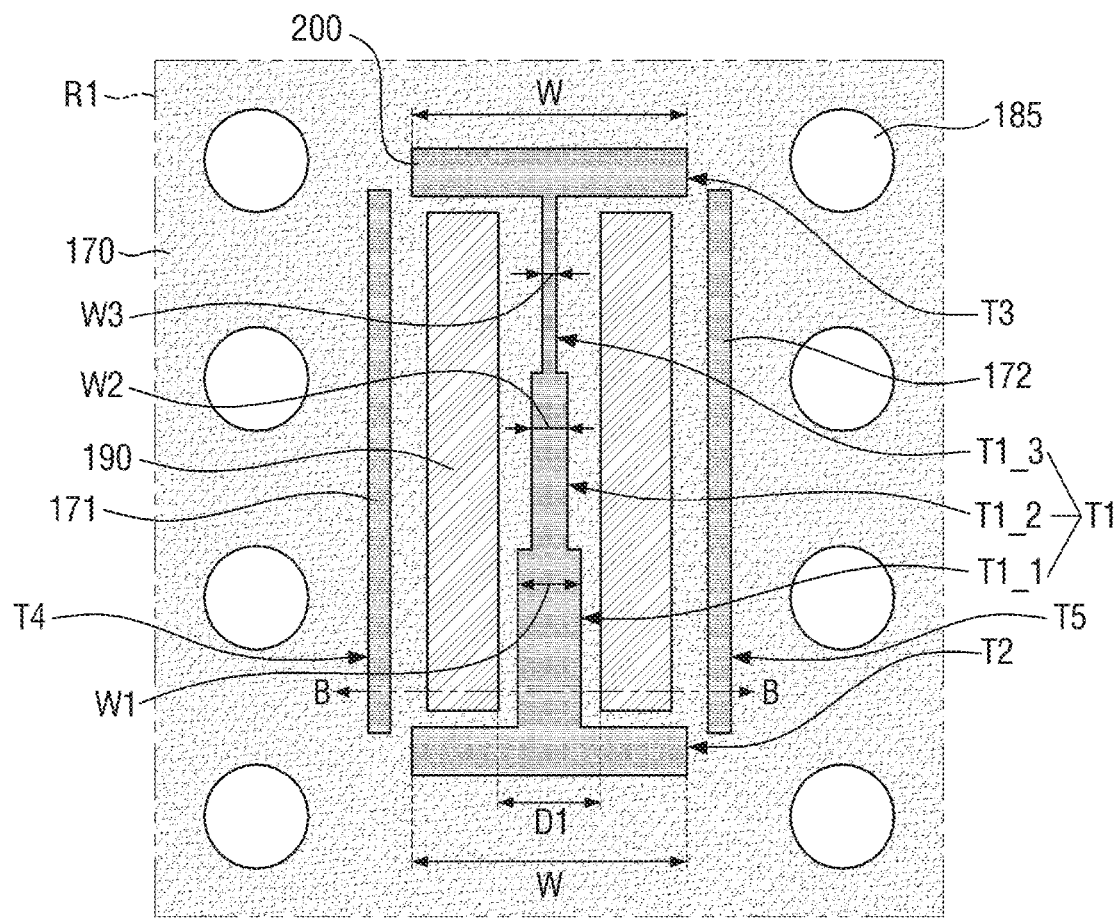
FIG. 10 is an enlarged view in which the region R1 of the semiconductor package of FIG. 1 is enlarged, according to example embodiments.
Figure 11:
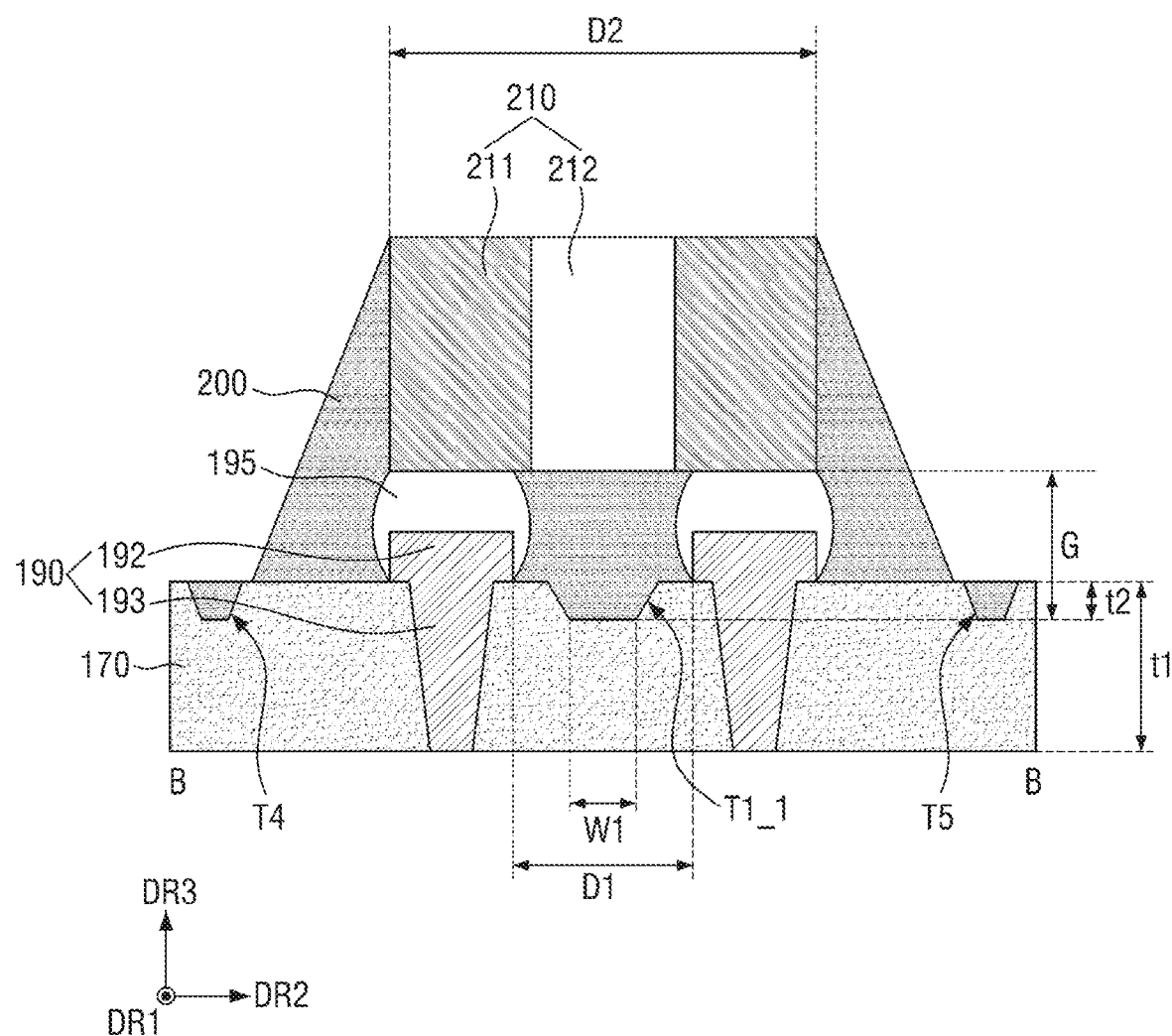
FIG. 11 is a cross-sectional view taken along a line B-B of FIG. 10, according to example embodiments.

FIG. 10 is an enlarged view in which the region R1 of FIG. 1 is enlarged. FIG. 11 is a cross-sectional view taken along a line B-B of FIG. 10. For convenience of explanation, points different from those explained with reference to FIGS. 1 to 7 will be mainly explained.

Referring to FIGS. 10 and 11, a semiconductor package according to example embodiments may further include fourth and fifth trenches T4 and T5.

The fourth trench T4 and the fifth trench T5 may be spaced apart from each other in the second direction DR2. Each of the fourth and fifth trenches T4 and T5 may be disposed between the first solder ball 185 and the second under bump metal layer 190 adjacent to the first solder ball 185. That is, the second under bump metal layer 190 may be disposed between the fourth and fifth trenches T4 and T5, and the first trench T1 may be disposed between the fourth and fifth trenches T4 and T5.

The fourth and fifth trenches T4 and T5 may extend in the first direction DR1. The length of the fourth and fifth trenches T4 and T5 in the first direction DR1 may be, for example, longer than the length of the second under bump metal layer 190 in the first direction DR1. However, the present disclosure is not limited thereto, and the lengths of the fourth and fifth trenches T4 and T5 in the first direction DR1 may be the same as or smaller than the length of the second under bump metal layer 190 in the first direction DR1.

The fourth and fifth trenches T4 and T5 may be spaced apart from the second trench T2 in the second direction DR2. The fourth and fifth trenches T4 and T5 may be spaced apart from the third trench T3 in the second direction DR2.

The depth t1 of the fourth and fifth trenches T4 and T5 in the third direction DR3 may be smaller than the thickness t2 of the second passivation layer 170 in the third direction DR3. The depth t1 of the fourth and fifth trenches T4 and T5 in the third direction DR3 may be, for example, equal to or less than 0.5 times the thickness t2 of the second passivation layer 170 in the third direction DR3. The depth t1 of the fourth and fifth trenches T4 and T5 in the third direction DR3 according to some embodiments may be approximately 0.5 times the thickness t2 of the second passivation layer 170 in the third direction DR3.

The depth t1 of the fourth and fifth trenches T4 and T5 in the third direction DR3 may be substantially the same as the depth t1 of the first to third trenches T1, T2 and T3 in the third direction DR3, and may be different as shown in this drawing.

The first underfill material layer 200 injected from the second trench T2 may fill the first trench T1 and the third trench T3. Excessively injected first underfill material layer 200 may be filled in the fourth or fifth trenches T4 and T5. Therefore, it is possible to prevent the first underfill material layer 200 from being formed on the first solder balls 185.

Figure 12:
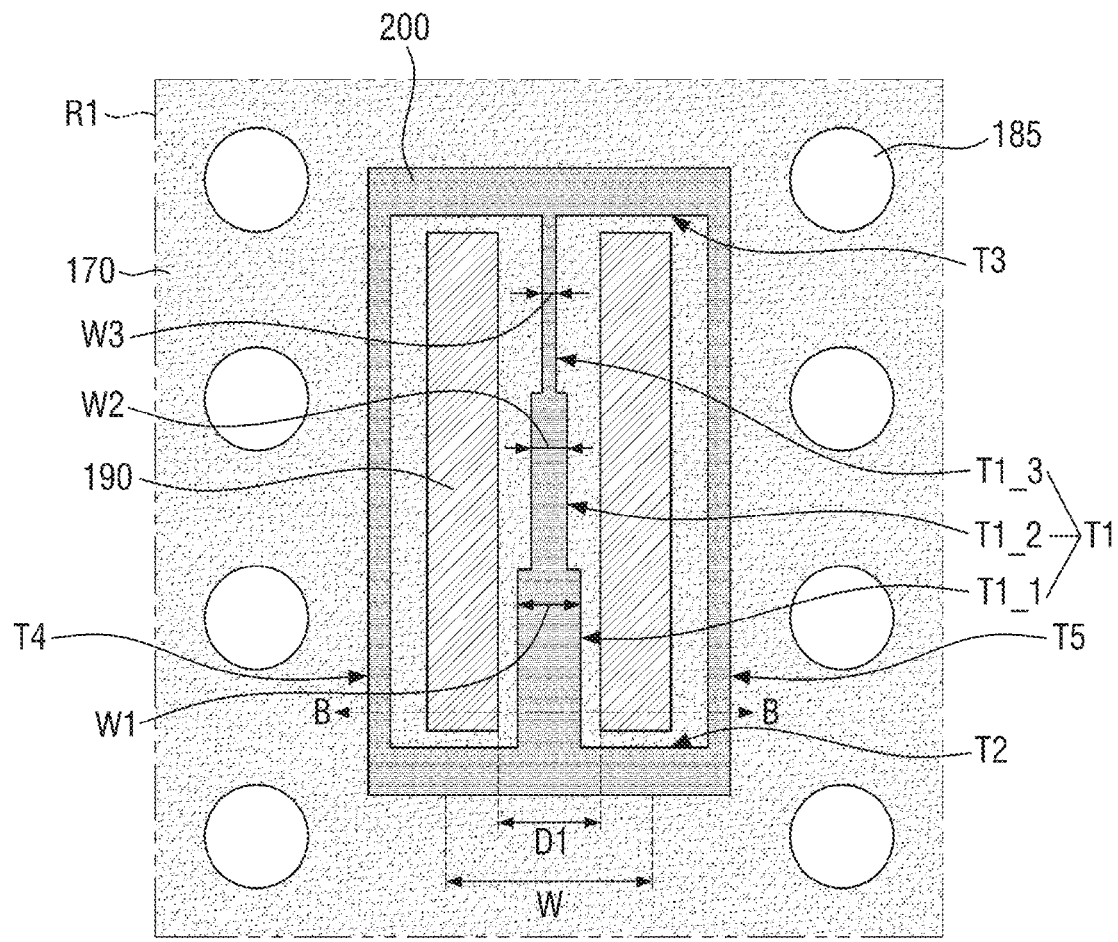
FIG. 12 is an enlarged view in which the region R1 of the semiconductor package of FIG. 1 is enlarged, according to example embodiments.

FIG. 12 is an enlarged view in which the region R1 of FIG. 1 is enlarged. For convenience of explanation, points different from those explained with reference to FIGS. 10 and 11 will be mainly explained.

Referring to FIG. 12, a semiconductor package according to example embodiments may further include fourth and fifth trenches T4 and T5. The fourth trench T4 extends in the first direction DR1 and may be connected to the second and third trenches T2 and T3. The fourth trench T4 may connect the second trench T2 and the third trench T3. The fifth trench T5 extends in the first direction DR1 and may connect the second and third trenches T2 and T3. The fifth trench T5 may connect the second trench T2 and the third trench T3.

That is, the first to fifth trenches T1, T2, T3, T4 and T5 may collectively surround a second under bump metal layer 190 in the plane of first direction DR1 and second direction DR2.

Figure 13:
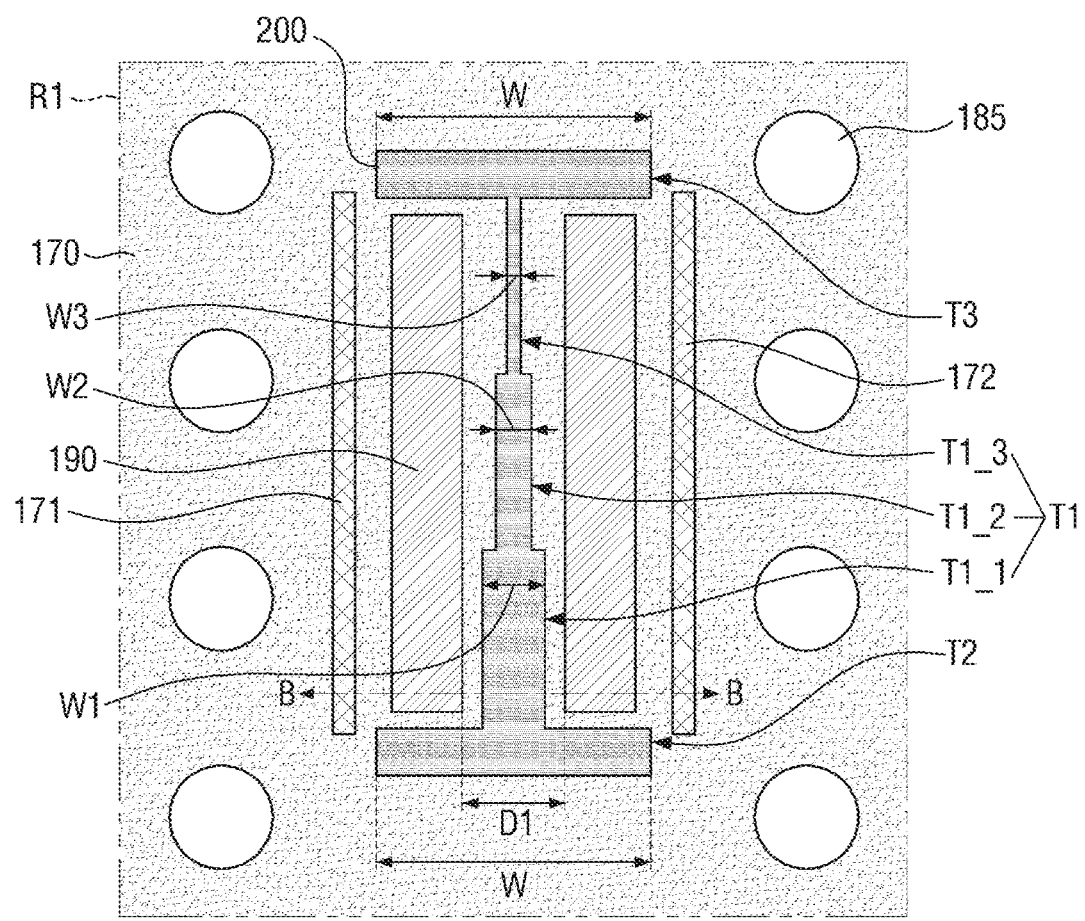
FIG. 13 is an enlarged view in which the region R1 of the semiconductor package of FIG. 1 is enlarged, according to example embodiments.
Figure 13:
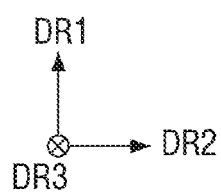
Figure 14:
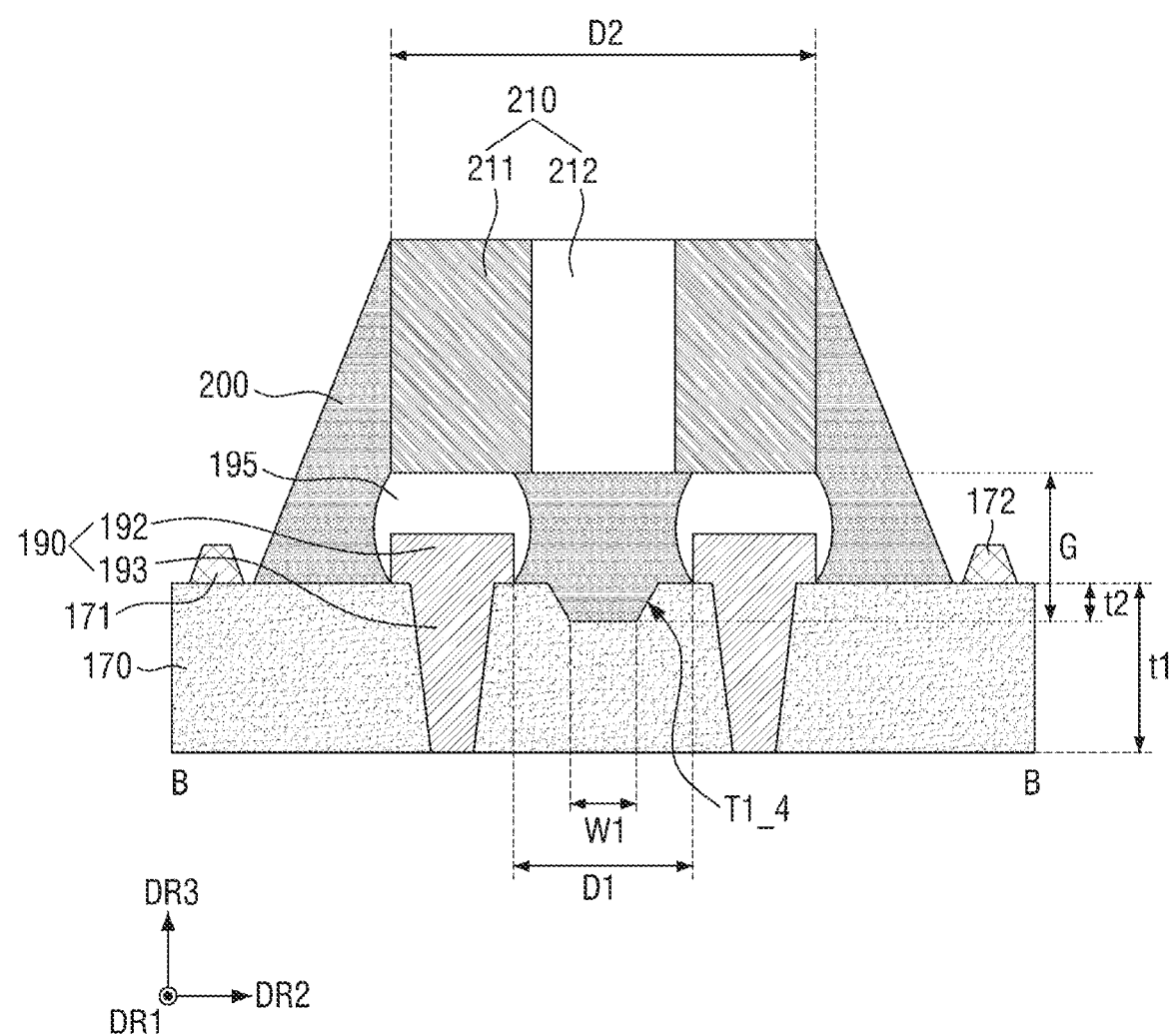
FIG. 14 is a cross-sectional view taken along a line B-B of FIG. 13, according to example embodiments.

FIG. 13 is an enlarged view in which the region R1 of FIG. 1 is enlarged. FIG. 14 is a cross-sectional view taken along a line B-B of FIG. 13. For convenience of explanation, points different from those explained with reference to FIGS. 1 to 7 will be mainly explained.

Referring to FIGS. 13 and 14, a semiconductor package according to example embodiments may further include a first dam 171 and a second dam 172.

The first dam 171 and the second dam 172 may be spaced apart from each other in the second direction DR2. The first and second dams 171 and 172 may be disposed between the first solder ball 185 and the second under bump metal layer 190 adjacent to the first solder ball 185, respectively. That is, the second under bump metal layer 190 may be disposed between the first and second dams 171 and 172, and the first trench T1 may be disposed between the first and second dams 171 and 172.

The first dam 171 and the second dam 172 may extend in the first direction DR1. As shown in this drawing, lengths of the first and second dams 171 and 172 in the first direction DR1 may be longer than a length of the second under bump metal layer 190 in the first direction DR1. However, the present disclosure is not limited thereto, and the lengths of the first and second dams 171 and 172 in the first direction DR1 may be the approximately same as or smaller than the length of the second under bump metal layer 190 in the first direction DR1.

The first and second dams 171 and 172 may be spaced apart from the second trench T2 in the second direction DR2. The first and second dams 171 and 172 may be spaced apart from the third trench T3 in the second direction DR2.

The first and second dams 171 and 172 may protrude from the second passivation layer 170 in the third direction DR3. The first and second dams 171 and 172 may prevent an overflow of the first underfill material layer 200 which is left after filling the first to third trenches T1, T2 and T3. The first and second dams 171 and 172 may prevent the first underfill material layer 200 from being formed on the first solder balls 185.

Figure 15:
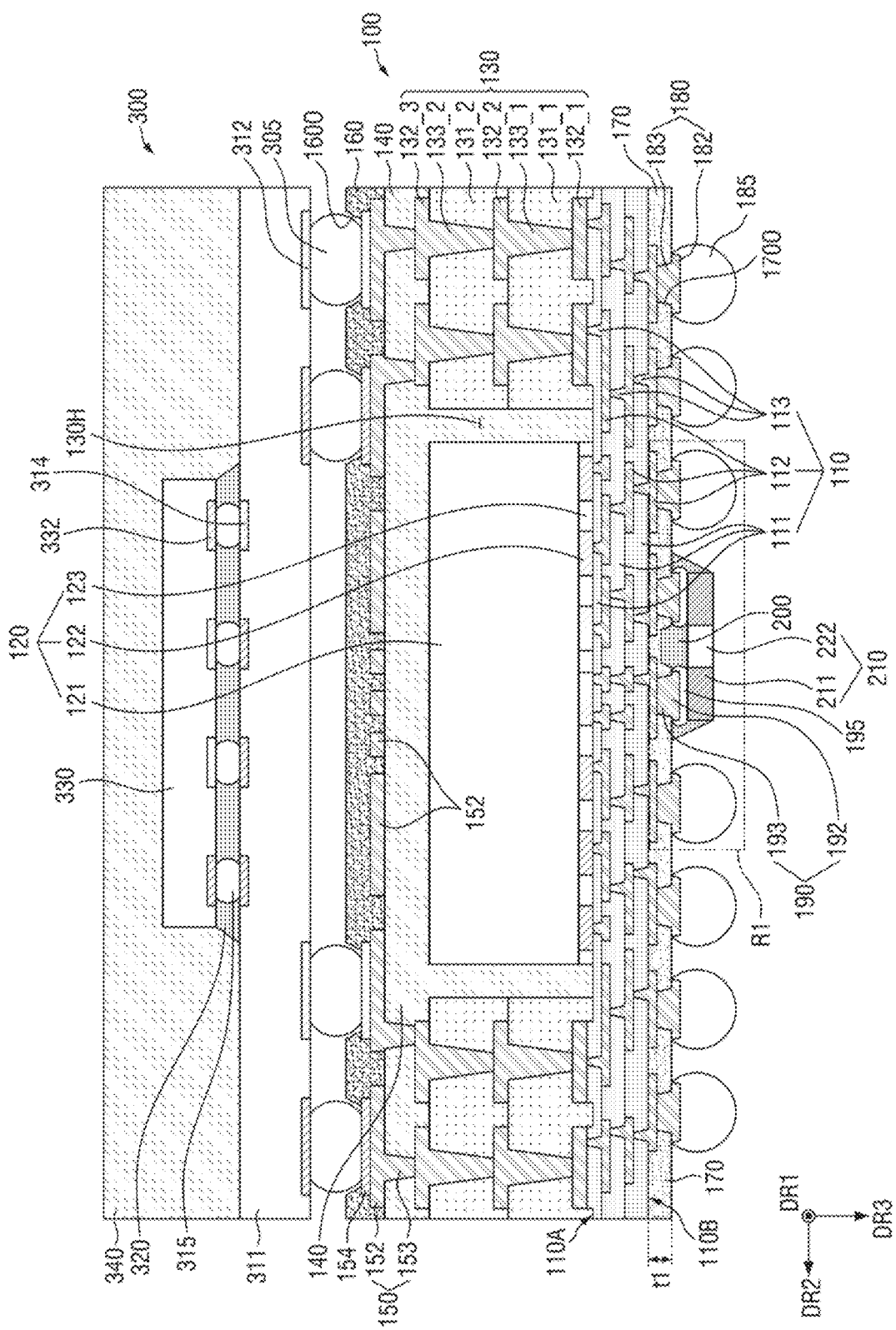
FIG. 15 is a diagram of a semiconductor package according to example embodiments.

FIG. 15 is a diagram of a semiconductor package according to example embodiments.

Referring to FIG. 15, a semiconductor package according to example embodiments may include a first semiconductor package 100 and a second semiconductor package 300. The first semiconductor package 100 may be any one of the semiconductor packages described with reference to FIGS. 1 to 14.

The second semiconductor package 300 may be disposed on the first semiconductor package 100. The second semiconductor package 300 may be disposed below the first semiconductor package 100 in the third direction DR3. The second semiconductor package 300 may be disposed on the first face 110A of the first connection structure 110.

The second semiconductor package 300 may include a substrate 311, a second semiconductor chip 330, a second underfill material layer 320 and a second molding layer 340.

The substrate 311 may be, for example, a printed circuit board (PCB) or a ceramic substrate. According to some embodiments, the substrate 311 may be an interposer. In some embodiments, the substrate 311 may be a substrate such as the second connection structure 150. However, the technical idea of the present disclosure is not limited thereto.

The substrate 311 may include a first conductive pad 312 and a second conductive pad 314. The first conductive pad 312 may be disposed on the upper face of the substrate 311 in the third direction DR3, and the second conductive pad 314 may be disposed on the lower face of the substrate 311 in the third direction DR3.

The second semiconductor chip 330 may be disposed on the substrate 311. The second semiconductor chip 330 may be a memory chip. The memory chip may be, for example, a volatile memory semiconductor chip such as a DRAM (Dynamic Random Access Memory) or an SRAM (Static Random Access Memory), or a non-volatile memory semiconductor chip such as a PRAM (Phase-change Random Access Memory), a MRAM (Magnetoresistive Random Access Memory), a FeRAM (Ferroelectric Random Access Memory) or a RRAM (Resistive Random Access Memory). The second semiconductor chip 330 may be, but is not limited to, a single semiconductor chip. For example, the second semiconductor chip 330 may be a stack of a plurality of memory semiconductor chips (All memory chips in the memory system taken together in one assembly, JEDEC Standard Definition). That is, the second semiconductor chip 330 may be made up of a plurality of slices (One memory chip in the stack of memory chips, JEDEC Standard Definition).

The second semiconductor chip 330 may include a second chip pad 332. The second chip pad 332 may be disposed on the upper face of the second semiconductor chip 330 in the third direction DR3. At least a part of the second chip pad 332 may be exposed on the upper face of the second semiconductor chip 330 in the third direction DR3.

The third solder ball 315 may be disposed between the substrate 311 and the second semiconductor chip 330. The third solder ball 315 may be in contact with the second chip pad 332 and the second conductive pad 314. Accordingly, the second semiconductor chip 330 may be electrically connected to the substrate 311.

The third solder ball 315 may have substantially the same size and shape as those of the first solder ball 185, the connection member 195 and the second solder ball 305, or may have different size and shape, as shown in the drawing.

The second underfill material layer 320 may fill between the substrate 311 and the second semiconductor chip 330. The second underfill material layer 320 may wrap the third solder ball 315 between the substrate 311 and the second semiconductor chip 330, and may fill between the third solder balls 315.

The second molding layer 340 may be disposed on the lower face of the second semiconductor chip 330 in the third direction DR3 and on the lower face of the substrate 311 in the third direction DR3. The second molding layer 340 may cover or overlap the lower face and the side faces of the second semiconductor chip 330, and the side faces of the second underfill material layer 320.

Or, the second molding layer 340 may expose the lower face of the second semiconductor chip 330 in the third direction DR3 unlike that shown in the drawing. That is, the lower face of the second molding layer 340 in the third direction DR3 may be placed on the same plane as the lower face of the second semiconductor chip 330 in the third direction DR3.

The second solder ball 305 may be disposed between the first semiconductor package 100 and the second semiconductor package 300. The second solder ball 305 may be in contact with the connection pad 154 and the first conductive pad 312 of the substrate 311. As a result, the second semiconductor package 300 may be electrically connected to the first semiconductor package 100.

The second solder balls 305 may have substantially the same size and shape as those of the first solder balls 185 and the connection member 195, or may have different size and shape, as shown in this drawing.

Figure 16:
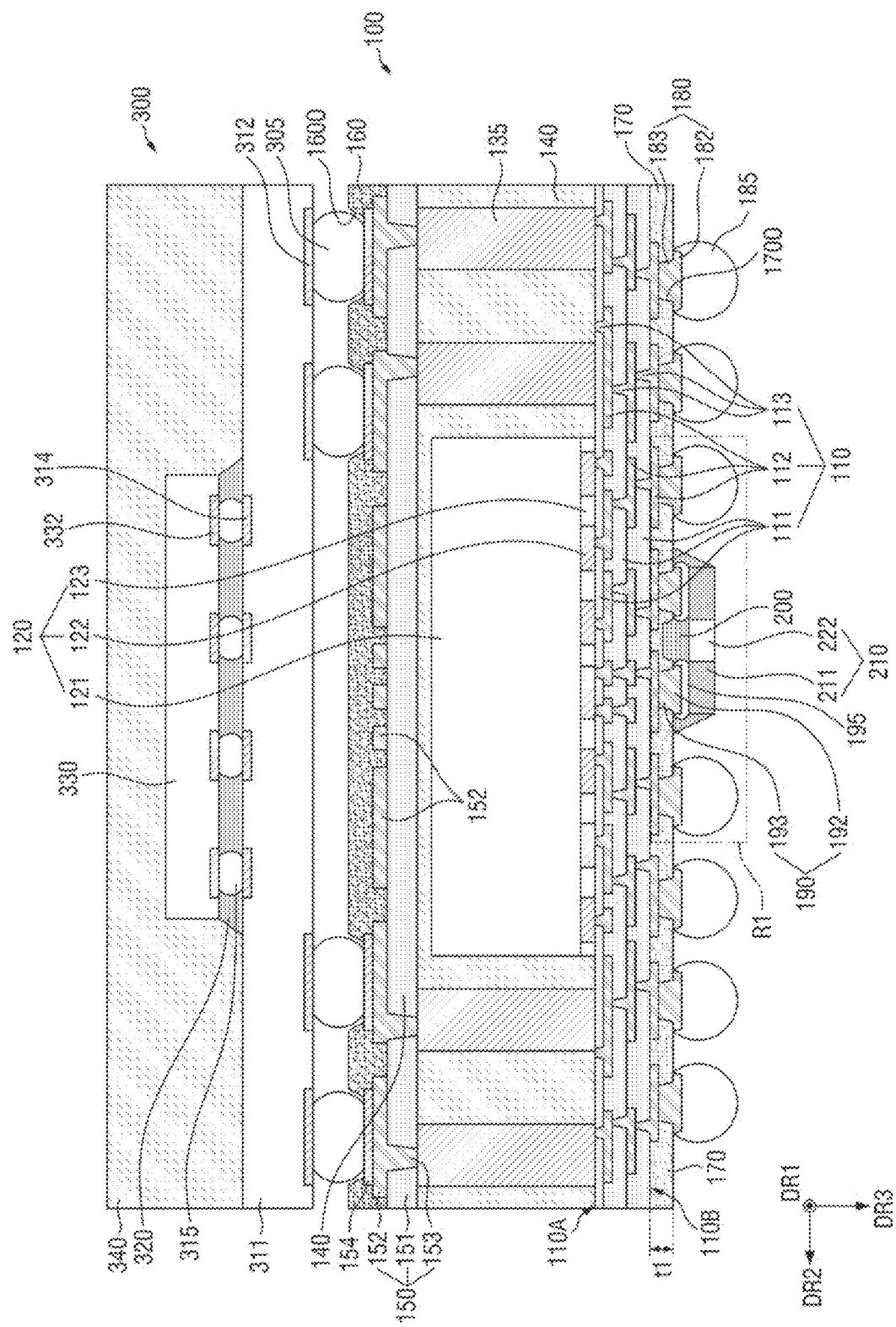
FIG. 16 is a diagram of a semiconductor package according to example embodiments.

FIG. 16 is a diagram of a semiconductor package according to example embodiments. For convenience of explanation, points different from those explained with reference to FIG. 15 will be mainly explained.

Referring to FIG. 16, a semiconductor package according to example embodiments may include a penetration via 135.

The penetration via 135 may be disposed on the first face 110A of the first connection structure 110. The penetration via 135 may penetrate the first molding layer 140.

The penetration via 135 may be disposed between the first connection structure 110 and the second connection structure 150. The penetration via 135 may be in contact with the exposed first via 113 of the first connection structure 110 and the exposed second via 153 of the second connection structure 150. This enables the second connection structure 150 to be electrically connected to the first connection structure 110 through the penetration via 135.

The second connection structure 150 may be disposed on the first molding layer 140. The second connection structure 150 may include a second insulating layer 151, a second redistribution layer 152 and a second via 153.

The second insulating layer 151 may be disposed on the first molding layer 140. The second redistribution layer 152 may be disposed on the second insulating layer 151. The second via 153 may penetrate the second insulating layer 151 and be in contact with the second redistribution layer 152 and the penetration via 135.

Figure 17:
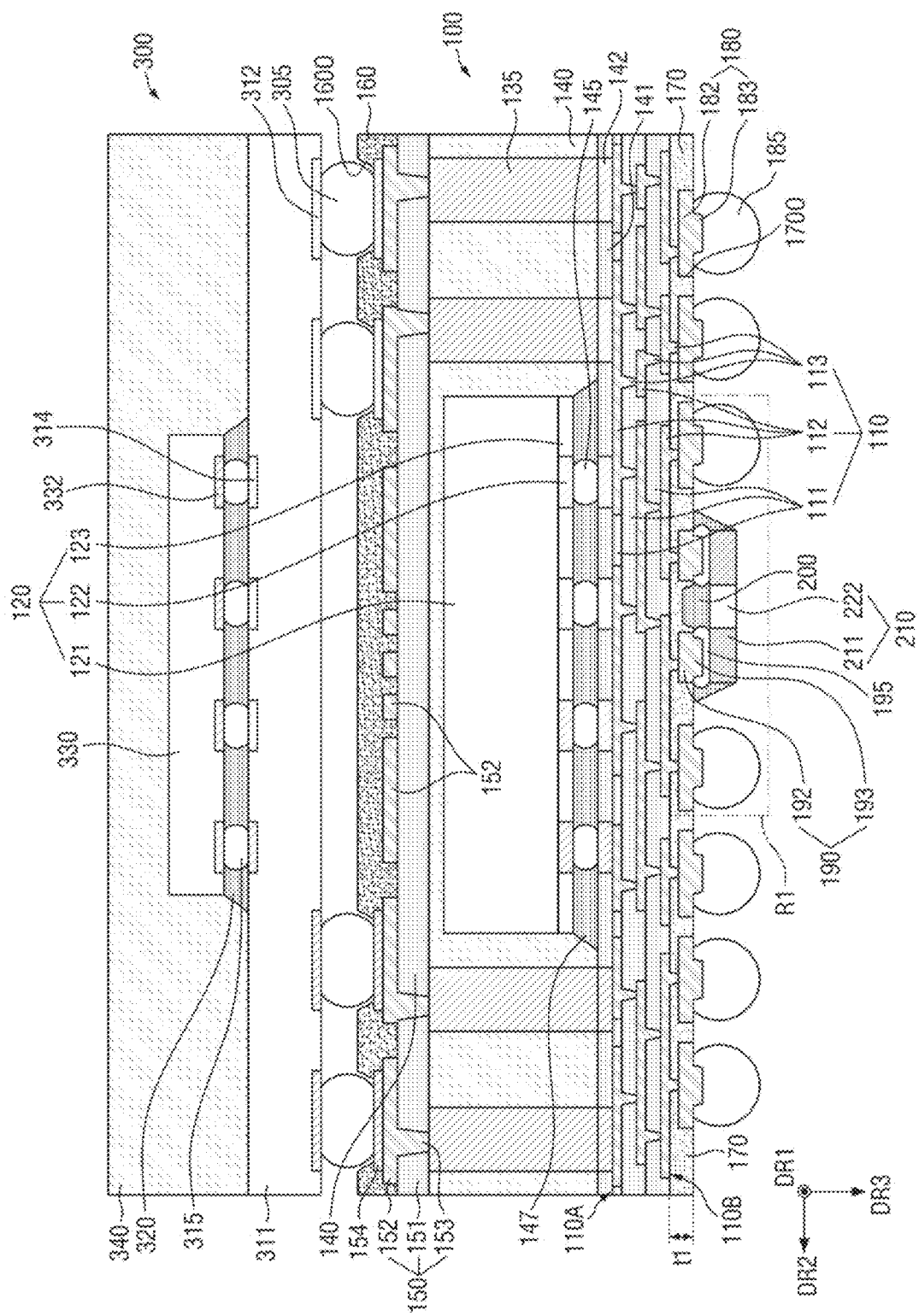
FIG. 17 is a diagram of a semiconductor package according to example embodiments.

FIG. 17 is a diagram of a semiconductor package according to example embodiments. For convenience of explanation, points different from those explained with reference to FIG. 16 will be mainly explained.

Referring to FIG. 17, the width of the first vias 113 may decrease in the third direction DR3 from the first face 110A to the second face 110B, in the semiconductor package according to some other embodiments of the present disclosure.

For example, the semiconductor package according to some embodiments may be formed by an RDL first process. In this case, the first connection structure 110 may be formed by being fixed with a wafer carrier or the like and stacked from the second face 110B. For example, the first insulating layers 111 may be formed by being sequentially stacked in the direction from the second face 110B to the first face 110A. After that, the first semiconductor chip 120 may be mounted on the first face 110A of the first connection structure 110. The first vias 113 may be formed through an etching process of removing a part of first insulating layers 111 to expose some of the first and second UBM vias 183 and 193.

The width of the first and second UBM vias 183 and 193 may decrease in the direction from the first face 110A to the second face 110B.

For example, the semiconductor package according to some embodiments may be formed by an RDL first process. In this case, the first and second UBM vias 183 and 193 may be formed through an etching process of removing a part of the first insulating layer 111 to expose a part of the second face 110B.

A third conductive pad 142 and a third passivation layer 141 may be disposed on the first face 110A of the first connection structure 110.

The third conductive pad 142 may be disposed on the first redistribution layer 112 exposed by the first insulating layer 111. The third conductive pad 142 may be connected to the first redistribution layer 112. The third passivation layer 141 may expose at least a part of the third conductive pad 142.

The first semiconductor chip 120 may be connected to the first connection structure 110 by the fourth solder ball 145. The fourth solder ball 145 may be in contact with the chip pad 122 and the third conductive pad 142. Accordingly, the first semiconductor chip 120 may be electrically connected to the first connection structure 110.

The fourth solder balls 145 may have substantially the same size and shape as those of the first to third solder balls 185, 305 and 315, or may have different size and shape as shown in this drawing.

The third underfill material layer 147 may fill between the third passivation layer 141 and the third conductive pad 142 and the first semiconductor chip 120. The third underfill material layer 147 may wrap the fourth solder balls 145 between the third passivation layer 141 and the third conductive pad 142 and the first semiconductor chip 120, and may fill between the fourth solder balls 145.

The penetration via 135 may be in contact with the third conductive pad 142. This enables the second connection structure 150 to be electrically connected to the first connection structure 110 through the penetration via 135.

In concluding the detailed description, those skilled in the art will appreciate that many variations and modifications may be made to the example embodiments without substantially departing from the principles of the present disclosure. Therefore, the disclosed example embodiments of the disclosure are used in a generic and descriptive sense only and not for purposes of limitation.

What is claimed is:

1. A semiconductor package comprising:
a connection structure comprising a redistribution layer;
a plurality of under bump metal layers on the connection structure and electrically connected to the redistribution layer;
a passivation layer on the connection structure, wherein the passivation layer overlaps at least portions of side faces of the plurality of under bump metal layers, and wherein the passivation layer comprises a first trench between under bump metal layers adjacent to each other among the plurality of under bump metal layers;
a surface mounting element that is on the under bump metal layers adjacent to each other, that is electrically connected to the redistribution layer, and that overlaps the first trench; and
an underfill material layer that is between a portion of the passivation layer and a portion of the surface mounting element, and is in the first trench,
wherein the first trench extends in a first direction that is a length direction of the surface mounting element, and comprises a first sub-trench having a first width in a second direction perpendicular to the first direction, and a second sub-trench having a second width different from the first width in the second direction,
wherein the first trench further comprises a third sub-trench connected to the second sub-trench and having a third width in the second direction,
wherein the second sub-trench is between the first sub-trench and the third sub-trench, and
wherein the second width is greater than the third width and smaller than the first width.

2. The semiconductor package of claim 1, wherein the first width is approximately 3 times the third width, and the second width is approximately twice the third width.

3. The semiconductor package of claim 1,
wherein the first width is approximately 0.6 times a distance the between the under bump metal layers adjacent to each other in the second direction,
wherein the second width is approximately 0.4 times a distance the between the under bump metal layers adjacent to each other in the second direction, and wherein the third width is approximately 0.2 times a distance the between the under bump metal layers adjacent to each other in the second direction.

4. The semiconductor package of claim 1, wherein the first sub-trench and the second sub-trench have a substantially equal depth in a third direction intersecting the first direction and the second direction.

5. The semiconductor package of claim 1, wherein a depth of the first trench in a third direction intersecting the first direction and the second direction is equal to or less than 0.5 times a thickness of the passivation layer in the third direction.

6. The semiconductor package of claim 1, wherein the passivation layer further comprises:
a second trench that is spaced apart from a first face of the surface mounting element in the first direction and is connected to the first sub-trench, and
a third trench that is spaced apart from a second face of the surface mounting element in the first direction and is connected to the second sub-trench,
wherein a width of the second trench and a width of the third trench in the second direction are greater than the first and second widths of the first trench.

7. The semiconductor package of claim 6,
wherein the width of the second trench in the second direction and the width of the third trench in the second direction are wider than a width of the surface mounting element in the second direction, and
wherein the underfill material layer is substantially uniformly distributed in a space between the passivation layer and the surface mounting element and into the first trench, the second trench, and the third trench.

8. The semiconductor package of claim 6, wherein a depth of the second trench in a third direction intersecting the first direction and the second direction and a depth of the third trench in the third direction are substantially equal to a depth of the first trench in the third direction.

9. The semiconductor package of claim 6, wherein the passivation layer further comprises:
a fourth trench that is spaced apart from a first face of the surface mounting element in the second direction and extends in the first direction, and
a fifth trench that is spaced apart from a second face of the surface mounting element in the second direction and extends in the first direction.

10. The semiconductor package of claim 9, wherein the fourth trench and the fifth trench are connected to the second trench and the third trench.

11. The semiconductor package of claim 1, wherein the passivation layer further comprises:
a first dam that is spaced apart from a first face of the surface mounting element in the second direction and protrudes from the passivation layer, and
a second dam that is spaced apart from a second face of the surface mounting element in the second direction and protrudes from the passivation layer,
wherein the first dam and the second dam extend in the first direction.

12. A semiconductor package comprising:
a connection structure comprising a redistribution layer;
under bump metal layers on the redistribution layer, wherein the under bump metal layers extend in a first direction and are spaced apart from each other in a second direction different from the first direction;
a passivation layer on the connection structure, wherein the passivation layer overlaps at least portions of side faces of the under bump metal layers and has an I-shaped trench extending in the first direction between the under bump metal layers;
a surface mount element on the under bump metal layers and electrically connected to the redistribution layer through the under bump metal layers; and
an underfill material layer that at least partially is between a portion of the passivation layer and a portion of the under bump metal layers, and is in the I-shaped trench,
wherein upper and lower portions of the I-shaped trench are wider than a middle portion of the I-shaped trench.

13. The semiconductor package of claim 12, wherein a length of the I-shaped trench in the first direction is longer than a length of the under bump metal layers in the first direction.

14. The semiconductor package of claim 12,
wherein the I-shaped trench comprises a first trench extending in the first direction, and a second trench and a third trench that extend in the second direction and are spaced apart from each other in the first direction,
wherein the first trench connects the second and third trenches, and
wherein a width of the second trench in the second direction and a width of the third trench in the second direction are greater than a width of the first trench in the second direction.

15. The semiconductor package of claim 14, wherein the width of the second trench in the second direction and the width of the third trench in the second direction are greater than a width of the surface mounting element in the second direction.

16. The semiconductor package of claim 14,
wherein the first trench comprises a first sub-trench connected to the second trench and having a first width in the second direction,
wherein the first trench further comprises a second-sub trench connected to the third trench and the first sub-trench and having a second width in the second direction, and
wherein the second width is less than the first width.

17. The semiconductor package of claim 14,
wherein the first trench comprises a first sub-trench having a first width in the second direction,
wherein the first trench further comprises a second sub-trench connected to the first sub-trench and having a second width in the second direction,
wherein the first trench further comprises a third sub-trench connected to the second sub-trench and the first sub-trench and having a third width in the second direction, and
wherein the first trench further comprises a fourth sub-trench connected to the first sub-trench and the second sub-trench and having a fourth width in the second direction, and
wherein the fourth width is greater than the first width, the first width is greater than the second width, and the second width is greater than the third width.

18. A semiconductor package comprising:
a connection structure comprising a redistribution layer and an insulating layer on the redistribution layer, and comprising a first face and a second face opposite to each other;
a molding layer on the first face of the connection structure, the molding layer comprising an opening that overlaps at least a part of the redistribution layer;
a semiconductor chip in the opening;
a chip pad on the semiconductor chip, wherein the chip pad is electrically connected to the redistribution layer;
a core layer comprising a core insulating layer, and a penetration via that penetrates the core insulating layer and is electrically connected to the redistribution layer, on a side face of the semiconductor chip;
a first under bump metal layer and second under bump metal layers connected to the redistribution layer, wherein the first under bump metal layer and the second under bump metal layers are on the second face of the connection structure;
a passivation layer on at least a part of respective side faces of the first under bump metal layer and the second under bump metal layers, and comprising a trench extending in a first direction between ones of the second under bump metal layers adjacent to each other;
a solder ball on the first under bump metal layer;
a surface mounting element electrically connected to the second under bump metal layers by a connection member and overlapping the trench; and
an underfill material layer that is between the passivation layer and the surface mounting element, and is in the trench,
wherein the trench comprises a first trench extending in the first direction, and second and third trenches each connected to the first trench and spaced apart from each other in the first direction,
wherein the first trench comprises first to third sub-trenches having respective first to third widths in a second direction that intersects the first direction and is a length direction of the connection structure,
wherein the second sub-trench is between the first sub-trench and the third sub-trench, and the second width is wider than the first width and smaller than the third width, and
wherein the respective second and third widths of the second and third trenches in the second direction are wider than a width of the surface mounting element in the second direction.

19. The semiconductor package of claim 18, wherein the penetration via comprises a plurality of core vias and a plurality of core wiring layers.

* * * * *